US009959675B2

(12) United States Patent
Gal et al.

(10) Patent No.: US 9,959,675 B2
(45) Date of Patent: May 1, 2018

(54) LAYOUT DESIGN USING LOCALLY SATISFIABLE PROPOSALS

(71) Applicant: Microsoft Corporation, Redmond, WA (US)

(72) Inventors: Ran Gal, Redmond, WA (US); Pushmeet Kohli, Cambridge (GB); Eyal Ofek, Redmond, WA (US); Lior Shapira, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 353 days.

(21) Appl. No.: 14/300,224

(22) Filed: Jun. 9, 2014

(65) Prior Publication Data

US 2015/0356774 A1  Dec. 10, 2015

(51) Int. Cl.
*G09G 5/00* (2006.01)
*G06T 19/00* (2011.01)
(Continued)

(52) U.S. Cl.
CPC ............ *G06T 19/006* (2013.01); *G06F 17/50* (2013.01); *G06T 19/20* (2013.01); *G06T 2219/2004* (2013.01)

(58) Field of Classification Search
None
See application file for complete search history.

(56) References Cited

U.S. PATENT DOCUMENTS 5,825,660 A * 10/1998 Cagan .................. G06F 17/509
703/2
2004/0100473 A1   5/2004 Grzeszczuk et al.
(Continued)

FOREIGN PATENT DOCUMENTS

EP    2378488 A2    10/2011

OTHER PUBLICATIONS

Lempitsky et al., Fusion Moves for Markov Random Field Optimization, IEEE Transactions on Pattern Analysis and Machine Intelligence, vol. 32, No. 8, Aug. 2010, pp. 1392-1405.*
Schmalstieg, et al., "Distributed Applications for Collaborative Augmented Reality", In Proceedings of IEEE Virtual Reality, Mar. 2002, 8 pages.
Fleury, et al., "A Generic Model for Embedding Users' Physical Workspaces into Multi-Scale Collaborative Virtual Environments", In 20th International Conference on Artificial Reality and Telexistence (ICAT), Dec. 1, 2010, 8 pages.
Morse, et al., "Image-Based Color Schemes", In Proceedings of IEEE International Conference on Image Processing, vol. 3, Sep. 16, 2007, pp. 497-500.

(Continued)

*Primary Examiner* — M Good Johnson
(74) *Attorney, Agent, or Firm* — Lyon & Harr, LLP; Mark A. Watson

(57) ABSTRACT

A "Layout Optimizer" provides various real-time iterative constraint-satisfaction methodologies that use constraint-based frameworks to generate optimized layouts that map or embed virtual objects into environments. The term environment refers to combinations of environmental characteristics, including, but not limited to, 2D or 3D scene geometry or layout, scene colors, patterns, and/or textures, scene illumination, scene heat sources, fixed or moving people, objects or fluids, etc., any of which may evolve or change over time. A set of parameters are specified or selected for each object. Further, the environmental characteristics are determined automatically or specified by users. Relationships between objects and/or the environment derived from constraints associated with objects and the environment are then used to iteratively determine optimized self-consistent and scene-consistent object layouts. This enables the Layout Optimizer to augment environments with arbitrary content in a structured constraint-based process that adapts to changing scenes or environments.

20 Claims, 9 Drawing Sheets

"Image Showing an Automatic Optimized Layout of a Virtual Racetrack Object Relative to Real Furniture in a User's Room, with a Virtual Race Car Object Interacting with the Virtual Racetrack Object"

(51) Int. Cl.
G06F 17/50 (2006.01)
G06T 19/20 (2011.01)

(56) References Cited

U.S. PATENT DOCUMENTS

| | | | |
|---|---|---|---|
| 2004/0111687 A1* | 6/2004 | Dhanwada | G06F 17/5072 716/122 |
| 2006/0038833 A1 | 2/2006 | Mallinson et al. | |
| 2011/0276364 A1* | 11/2011 | Bergstrom | G06Q 10/04 705/7.29 |
| 2011/0316845 A1 | 12/2011 | Roberts et al. | |
| 2012/0041722 A1* | 2/2012 | Quan | G06T 7/0071 703/1 |
| 2012/0229508 A1* | 9/2012 | Wigdor | G06F 3/147 345/633 |
| 2012/0242798 A1 | 9/2012 | Mcardle et al. | |
| 2012/0264510 A1* | 10/2012 | Wigdor | A63F 13/213 463/31 |
| 2012/0307075 A1 | 12/2012 | Margalit | |
| 2014/0040855 A1* | 2/2014 | Wang | G06F 9/4436 717/107 |

OTHER PUBLICATIONS

Perazzi, et al., "Saliency Filters: Contrast based Filtering for Salient Region Detection", In Proceedings of IEEE Conference on Computer Vision and Pattern Recognition, Jun. 16, 2012, 8 pages.
"Architip", Retrieved on: Mar. 10, 2014 Available at: http://architip.mobi.
Azuma, et al., "Recent Advances in Augmented Reality", In Journal of IEEE Computer Graphics and Applications, vol. 21, Issue 6, Nov. 2001, pp. 1-15.
Besag, Julian, "On the Statistical Analysis of Dirty Pictures", In Journal of the Royal Statistical Society, vol. 48, No. 3, Retrieved on: Mar. 10, 2014, pp. 259-302.
Borning, et al., "Ultraviolet: A Constraint Satisfaction Algorithm for Interactive Graphics", In International Journal of Constraints, vol. 3, No. 1, Apr. 1998, pp. 1-26.
Boykov, et al., "Fast Approximate Energy Minimization via Graph Cuts", In Journal of IEEE Transactions on Pattern Analysis and Machine Intelligence, vol. 23, Issue 11, Nov. 2001, pp. 1222-1239.
Carmigniani, et al., "Augmented Reality Technologies, Systems and Applications", In Journal of Multimedia Tools and Applications, vol. 51, Issue 1, Jan. 2011, 2 pages.
Casella, et al., "Explaining the Gibbs Sampler", In American Statistician, vol. 46, Issue 3, Aug. 1992, pp. 166-174.
Fisher, et al., "Example-Based Synthesis of 3D Object Arrangements", In Journal of ACM Transactions on Graphics, vol. 31, Issue 6, Nov. 2012, 11 pages.
Gould, et al., "Alphabet Soup: A framework for Approximate Energy Minimization", In Proceedings of IEEE Conference on Computer Vision and Pattern Recognition, Jun. 20, 2009, pp. 1-8.
Grasset, et al., "Interactive Mediated Reality", In Proceedings of the Second IEEE and ACM International Symposium on Mixed and Augmented Reality, Oct. 7, 2013, 1 page.
Hastings, W. K., "Monte Carlo Sampling Methods using Markov Chains and their Applications", In Proceedings of Biometrika, vol. 57, No. 1, Apr. 1970, pp. 96-109.
Ishikawa, Hiroshi, "Higher-Order Gradient Descent by Fusion-Move Graph Cut", In Proceedings of Twelfth IEEE International Conference on Computer Vision, Sep. 27, 2009, pp. 1-7.
Jones, et al., "Illumiroom: Peripheral Projected Illusions for Interactive Experiences", In Proceedings of ACM SIGGRAPH Emerging Technologies, Jul. 21, 2013, 1 page.
"Junaio", Retrieved on: Mar. 10, 2014 Available at: http://www.junaio.com.
Jung, et al., "Local Rules for Global Map: When do they Work?", In Proceedings of Advances in Neural Information Processing Systems, Dec. 7, 2009, pp. 1-15.

Kohli, et al., P3 & Beyond: Solving Energies with Higher Order Cliques, In Proceedings of IEEE Conference on Computer Vision and Pattern Recognition, Jun. 17, 2007, 8 pages.
Kolmogorov, Vladimir, "Convergent Tree-Reweighted Message Passing for Energy Minimization", In Proceedings of IEEE Transactions on Pattern Analysis and Machine Intelligence, vol. 28, Issue 10, Oct. 2006, pp. 1-16.
Komodakis, et al., "A New Framework for Approximate Labeling via Graph Cuts", In Proceedings of the Tenth IEEE International Conference on Computer Vision, Oct. 17, 2005, 8 pages.
Kschischang, et al., "Factor Graphs and the Sum-Product Algorithm", In Journal of IEEE Transactions on Information Theory, vol. 47, Issue 2, Feb. 2001, pp. 498-519.
Kumar, Vipin, "Algorithms for Constraint Satisfaction Problems: A Survey", In Journal of AI Magazine, vol. 13, Issue 1, Apr. 1, 1992, pp. 32-44.
"Layar", Retrieved on: Mar. 10, 2014 Available at: http://www.layar.com.
Lempitsky, et al., "Fusion Moves for Markov Random Field Optimization", In Journal of IEEE Transactions on Pattern Analysis and Machine Intelligence, vol. 32, Issue 8, Aug. 2010, pp. 1-15.
Lin, et al., "Probabilistic Color-by Numbers: Suggesting Pattern Colorizations using Factor Graphs", In Journal of ACM Transactions on Graphics (TOG)—SIGGRAPH Conference, vol. 32, Issue 4, Jul. 2013, 12 pages.
Mackworth, Alan K., "Consistency in Networks of Relations", In Proceedings of Artificial Intelligence, vol. 8, Issue 1, Feb. 1977, pp. 99-118.
Schavemaker, et al., "Augmented Reality and the Museum Experience", In Proceedings of Museums and the Web, Apr. 6, 2011, 18 pages.
Merrell, et al., "Interactive Furniture Layout using Interior Design Guidelines", In Proceedings of ACM Transactions on Graphics, vol. 30, No. 4, Jul. 2011, 10 pages.
Newcombe, et al., "Kinectfusion: Real-time Dense Surface Mapping and Tracking", In Proceedings of the 10th IEEE International Symposium on Mixed and Augmented Reality, Oct. 26, 2011, 10 pages.
Yu, et al., "Make it Home: Automatic Optimization of Furniture Arrangement", In Journal of ACM Transactions on Graphics, vol. 30, No. 4, Jul. 2011, 11 pages.
Pearl, Judea, "Reverend Bayes on Inference Engines: A Distributed Hierarchical Approach", In Proceedings of the American Association of Artificial Intelligence National Conference on AI, Aug. 18, 1982, pp. 133-136.
Szeliski, et al., "A Comparative Study of Energy Minimization Methods for Markov Random Fields", In Proceedings of 9th European Conference on Computer Vision, May 7, 2006, pp. 16-29.
"Unity 3D", Retrieved on: Mar. 10, 2014 Available at: http://unity3d.com/.
Veksler, Olga, "Graph Cut Based Optimization for MRFs with Truncated Convex Priors", In Proceedings of IEEE Conference on Computer Vision and Pattern Recognition, Jun. 17, 2007, pp. 1-8.
Wainwright, et al., "Map Estimation via Agreement on Trees: Message-Passing and Linear Programming", In Proceedings of IEEE Transactions on Information Theory, vol. 51, Issue 11, Nov. 2005, pp. 1-25.
"Wikitude", Retrieved on: Mar. 10, 2014 Available at: http://www.wikitude.com.
Woodford, et al., "Global Stereo Reconstruction under Second Order Smoothness Priors", In Proceedings of IEEE Computer Society Conference on Computer Vision and Pattern Recognition, Jun. 24, 2008, 8 pages.
Yeh, et al., "Synthesizing Open Worlds with Constraints using Locally Annealed Reversible Jump MCMC", In Journal of ACM Transactions on Graphics (TOG)—SIGGRAPH Conference, vol. 31, Issue 4, Jul. 2012, 10 pages.
Milgram, et al., "Augmented Reality: A Class of Displays on the Reality-virtuality Continuum", In Proceedings of the Telemanipulator and Telepresence Technologies, vol. 2351, Dec. 21, 1995, pp. 282-292.
"Second Written Opinion Issued in PCT Application No. PCT/US2015/034322", dated May 24, 2016, 5 Pages.

(56) References Cited

OTHER PUBLICATIONS

"International Search Report and Written Opinion Issued in PCT Application No. PCT/US2015/034322", dated Sep. 17, 2015, 11 Pages.

Smith, et al., "3D Scene Manipulation With 2D Devices and Constraints", In Proceedings of the Graphics Interface Jun. 7, 2001, pp. 135-142.

Xu, et al., "Constraint-Based Automatic Placement for Scene Composition", In Proceedings of the Graphics Interface, May 27, 2002, pp. 25-34.

"International Preliminary Report on Patentability Issued in PCT Application No. PCT/US2015/034322", dated Sep. 19, 2016, 9 Pages.

* cited by examiner

Example Hyper and Factor Graphs for a 3 Constraint, 5 Object System

LAYOUT DESIGN USING LOCALLY SATISFIABLE PROPOSALS

BACKGROUND

Many applications and games in augmented reality devices and scenarios add augmented content, such as 2D overlays, text, virtual objects, etc. Augmented content may also be added to other types of applications, such as 2D overlays and text over an image. Some of these approaches use the location of the user and the orientation of the user's mobile device to add 2D overlays over the user's view. For location-specific apps, e.g., archaeological sites, museums, manufacturing floors, projection mapping, etc., the geometry of a site is sometimes computed in advance for use in positioning such overlays within an image or scene. Further, recent work in this area has also used 3D geometry recovered from a scene to position overlays and objects within the scene. In such cases, the recovered 3D geometry is often used to demonstrate various physical simulation examples or to provide various 2D or 3D graphical or textual overlays and the like for use in augmenting such scenes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Further, while certain disadvantages of prior technologies may be noted or discussed herein, the claimed subject matter is not intended to be limited to implementations that may solve or address any or all of the disadvantages of those prior technologies.

In general, a "Layout Optimizer," as described herein, provides various real-time iterative constraint-satisfaction methodologies that use a constraint-based framework to dynamically generate optimized layouts for mapping or embedding virtual objects into environments. In other words, the Layout Optimizer uses constraint-based relationships between objects and/or the environment that are derived from constraints associated with object parameters and environmental characteristics. An iterative process then determines optimized self-consistent and scene-consistent object layouts within the environment. These capabilities enable a wide range of uses, including, for example, using virtual content to alter or augment the physical reality of real-world scenes, such as the case of a virtual character in a game that reacts to and uses the real environment in which the game is played.

More specifically, given an arbitrary dynamic environment for which conditions or characteristics are either specified by a user or determined automatically, the Layout Optimizer creates a layout for two or more virtual objects using a novel solution-space exploration methodology. This methodology exploits the fact that for many types of constraints, satisfiable layout assignments can be found efficiently, in other words, these constraints are locally satisfiable. This allows the Layout Optimizer to sample candidate object values from a partial probability distribution function for each constraint. Advantageously, the sampling methodology enabled by the Layout Optimizer has been observed to reduce the number of samples used by other algorithms by orders of magnitude, thus enabling the Layout Optimizer to find object layouts in real-time that are consistent with the constraints, with other objects and with the environment.

In various implementations, the Layout Optimizer begins operation by receiving a set of one or more virtual objects and a set of parameters for each virtual object. In addition, the Layout Optimizer receives or automatically determines characteristics of an arbitrary environment into which the virtual objects will be mapped. The layout optimizer also receives a set of constraints that define relative relationships or interactions between any one or more objects, the parameters of one or more of those objects, and/or the environment. An initial layout for each virtual object is then either input by a user or automatically set by the Layout Optimizer to map each of the virtual objects into the environment. Note that the initial placement doesn't necessarily conform to the constraints, that happens during the optimization process. Finally, the Layout Optimizer performs iterative updates of the layouts of each object until a global cost of the constraints is minimized, or until some maximum number of iterations has been reached. Note that in various implementations, each iteration uses locally satisfiable proposals to simultaneously update and optimize the layouts of all of the virtual objects relative to one or more of the other virtual objects and the characteristics of the environment.

In view of the above summary, it is clear that the Layout Optimizer described herein provides various techniques for dynamically generating optimized layouts that map or embed virtual objects into environments. In addition to the just described benefits, other advantages of the Layout Optimizer will become apparent from the detailed description that follows hereinafter when taken in conjunction with the accompanying drawing figures.

BRIEF DESCRIPTION OF THE DRAWINGS

The specific features, aspects, and advantages of the claimed subject matter will become better understood with regard to the following description, appended claims, and accompanying drawings where:

DETAILED DESCRIPTION OF THE IMPLEMENTATIONS

Figure 1:
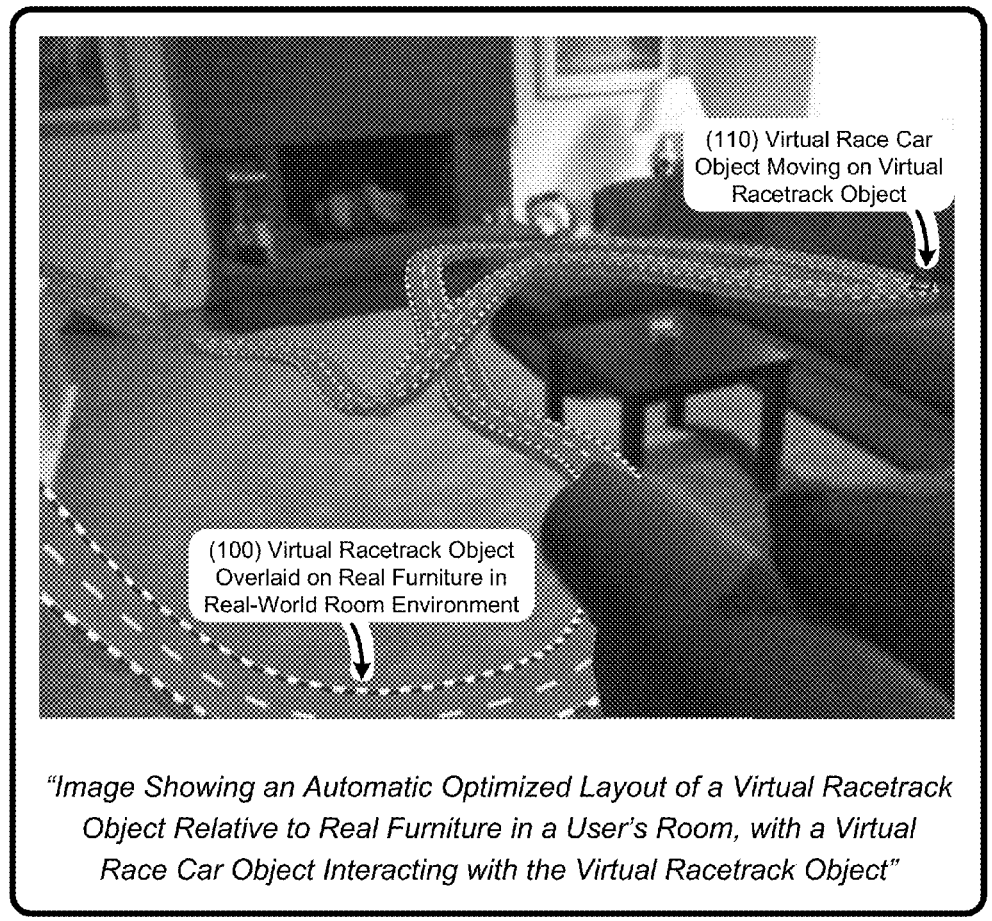
FIG. 1 provides an image showing an automatic optimized layout of a virtual race track object relative to real furniture in a user's room to create a racing game that is automatically tailored to the user's environment, with a virtual race car object interacting with the virtual race track object, as described herein FIG. 2 provides an exemplary architectural flow diagram that illustrates program modules for implementing various implementations of a Layout Optimizer, as described herein.

In the following description of the implementations of the claimed subject matter, reference is made to the accompanying drawings, which form a part hereof, and in which is shown by way of illustration specific implementations in which the claimed subject matter may be practiced. It should be understood that other implementations may be utilized and structural changes may be made without departing from the scope of the presently claimed subject matter.

1.0 Introduction:

In general, a "Layout Optimizer," as described herein, provides various techniques for dynamically generating optimized layouts that map or embed virtual objects into environments. In various implementations, the Layout Optimizer begins operation by receiving a set of one or more virtual objects and a set of parameters for each virtual object. In addition, the Layout Optimizer receives or automatically determines characteristics of an arbitrary environment into which the virtual objects will be mapped. The layout optimizer also receives a set of constraints that define relative relationships or interactions between any one or more objects, the parameters of one or more of those objects, and/or the environment.

An initial layout for each virtual object is then either input by a user or automatically set by the Layout Optimizer to map each of the virtual objects into the environment. Finally, the Layout Optimizer performs iterative updates of the layouts of each object until a global cost of the constraints is minimized, or until some maximum number of iterations has been reached. Note that in various implementations, each iteration uses locally satisfiable proposals to simultaneously update and optimize the layouts of all of the virtual objects relative to one or more of the other virtual objects and the characteristics of the environment.

Advantageously, the Layout Optimizer is adaptable for use in enhancing the content of arbitrary 2D and 3D environments in real-time, and is operable for use with desktop or mobile computing platforms (e.g., tablets, mobile phones, notebooks, netbooks, media players, game consoles, smart homes, projection of objects onto a stage of a theater or onto other surfaces or spaces, etc.), as well as wearable computing platforms or displays (e.g., virtual reality glasses, head-wearable display devices, etc.). Further, the enhancement of arbitrary environments provided by the Layout Optimizer is achieved by automatically optimizing layouts of virtual objects in arbitrary environments. Advantageously, these layouts are both self-consistent, i.e., consistent with the placement of other virtual objects, as well as scene-consistent, i.e., consistent with the geometry or other characteristics of the scene or physical environment into which those virtual objects are being placed. For example, layout constraints for placing virtual objects within a scene may specify placing those objects within two feet of each other (self-consistent) while also placing those objects on an elevated horizontal surface such as a table (scene-consistent).

FIG. 1 provides a simple example of a dynamic computer game using 3D models that is enabled by the Layout Optimizer. In particular, FIG. 1 shows a virtual racetrack object 100 that is overlaid on real-time images of furniture in a room occupied by a user, with the optimum layout of that racetrack object being determined by the Layout Optimizer in accordance with the constraints associated with that racetrack object. A virtual race car object 110 or the like can then operate on that virtual racetrack object 100 in accordance with any constraints associated the virtual racetrack object, the virtual race car object, and the real environment.

In this example, the racetrack object 100 is dynamically shaped and adapted to conform to the furniture in the room during the iterative layout process provided by the Layout Optimizer. The user can then view that layout and interact with the racetrack object 100 and/or the race car object via any display device (e.g., head-worn display or glasses, television screen, mobile device such as a smartphone, etc.) coupled to a computing device, gaming device, etc. Note also that environmental characteristics of the room may change at any time changes (i.e., changes to the environment), such as people entering the room, furniture being moved, lights turned on or off, etc. In cases where the environment of the room changes, in various implementations, the Layout Optimizer will dynamically adjust the layout of the racetrack object 100 and/or the race car object 110, in real-time to conform to the changes to the room in accordance with the constraints associated with the objects and the environment.

1.1 General Definitions and Considerations:

The term "object" is defined herein as referring to any 2D or 3D content including, but not limited to, images, text, advertisements, 2D or 3D static or dynamic models, video sequences, controlled physical objects that can be positioned in the environment (such as lights, speakers, robots), etc., that can be used to augment a real or virtual image, scene, or video sequence. As such, the layout of objects determined by the Layout Optimizer can incorporate any combination of object types or classes. Examples of classes include, but are not limited to, object, viewing frustum, polygon etc. Each of these classes has a specific set of properties or parameters that can be optimized. Examples of these properties include, but are not limited to, position, rotation, scale, color, material, transparency, texture, audio characteristics (e.g., amplitude, frequency, etc.), mass, shape (e.g., shape of an object fit to one or more features in the environment), selection of animations, etc. Note that in various implementations, the layout of objects is automatically adapted to changes in the characteristics of the environment in which those objects are placed (for example, see the preceding discussion of FIG. 1).

The terms "object parameters" or simply "parameters" are defined herein as referring to object characteristics, including, but not limited to, object geometric properties (e.g., position, rotation, scale, possible poses or configurations, etc.), object material properties (e.g., color, specularity, texture, etc.), physical properties (e.g., mass, elasticity, etc.), audio, animation, shape, etc. In various implementations, object parameters are manually specified for one or more objects. Alternately, or in combination, in various implementations, a user interface or the like is provided that enables the user to access, specify, or otherwise select from a library of predefined or customizable object parameters. Note also that in various implementations, the objects themselves (or object models or images) are either provided by the user, or selected from a library of predefined or customizable objects. In addition, it should be understood that objects may be dynamic (e.g., motion, color, scale, pose, etc.) such that one or more of the parameters may change over time. Consequently, whenever any parameter of any object changes, the Layout Optimizer can determine new optimized layouts for all objects (or objects within some range of other objects having changed parameters) using the techniques described herein relative to the changed parameters of any one or more objects.

Further, the term or "environment" is defined herein as referring to any combination of environmental characteristics. These environmental characteristics include, but are not limited to, 2D or 3D room or scene geometry or layout, colors, patterns, and/or textures of the scene and/or objects within the scene, scene illumination sources, levels and/or directions, scene heat sources and/or levels, characteristics of fixed or moving objects or fluids within the scene, etc. Further, it should be understood that the environment is dynamic in the sense that any or all of the environmental characteristics may evolve or change over time. In various implementations, environmental characteristics of 2D or 3D scenes (e.g., the furniture layout in a user's room as shown in FIG. 1), or larger outdoor spaces (houses, neighborhoods, landscapes, etc.), are automatically determined using conventional techniques (e.g., scan room or other space using cameras, LIDAR, laser scanners, Kinect® type devices, etc. Alternately, or in combination, one or more of these characteristics are manually specified. Alternately, or in combination, in various implementations, a user interface or the like is provided that enables the user to access, specify, or otherwise select from a library of predefined or customizable environmental characteristics.

The term "constraint," as discussed herein, refers to parameters or the like that are evaluated as cost functions by the Layout Optimizer. These constraints reference the properties defined for, or associated with, any object and/or the environment. As noted above, such constraints are used to determine self-consistent and scene-consistent relationships or interactions between any one or more objects and/or the environment. In various implementations, constraints that define relationships in a relative layout design are manually specified via a constraint script, or the like, for one or more objects and/or the environment. Alternately, or in combination, in various implementations, a user interface, or the like, is provided that enables the user to access, specify, or otherwise select from a library of predefined or customizable constraints.

Finally, the terms "object layout" or simply "layout" are defined herein to refer to the layouts of objects that are iteratively determined and optimized by the Layout Optimizer based on some initial relative layout design that collectively includes the virtual objects, the parameters of those objects, the environment and any associated constraints. Attributes of object layouts include, but are not limited to, relative object poses, rotations, scales, colors, textures, placements, positions or motions of objects in 2D or 3D scenes or environments, etc. Further, as noted above, these optimized layouts are both self-consistent and scene-consistent in accordance with the parameters and constraints associated with any of the objects and the environment.

Figure 2:
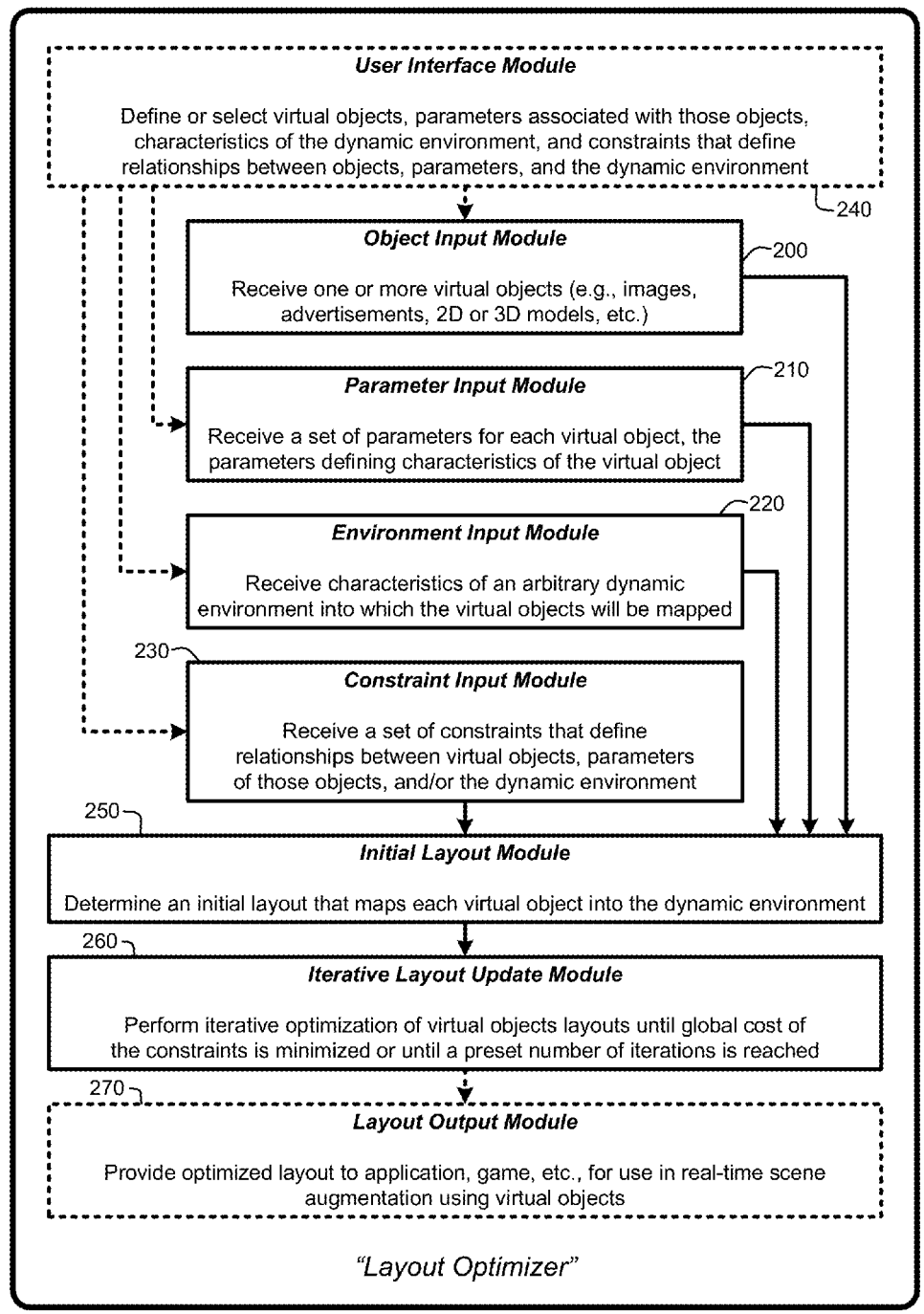

1.2 System Overview:

As noted above, the "Layout Optimizer," provides various techniques for dynamically generating optimized layouts that map or embed virtual objects into environments. The processes summarized above are illustrated by the general system diagram of FIG. 2. In particular, the system diagram of FIG. 2 illustrates the relationships between program modules for implementing various implementations of the Layout Optimizer, as described herein. Furthermore, while the system diagram of FIG. 2 illustrates a high-level view of various implementations of the Layout Optimizer, FIG. 2 is not intended to provide an exhaustive or complete illustration of every possible implementation of the Layout Optimizer as described throughout this document.

In addition, it should be noted that any boxes and interconnections between boxes that may be represented by broken or dashed lines in FIG. 2 represent alternate implementations of the Layout Optimizer described herein. Further, any or all of these alternate implementations, as described below, may be used in combination with other alternate implementations that are described throughout this document.

In general, as illustrated by FIG. 2, the processes enabled by the Layout Optimizer begin operation by using an object input module 200 to receive one or more virtual objects (e.g., images, advertisements, 2D or 3D models, etc.). In addition, a parameter input module 210 then receives a set of parameters for each virtual object. As discussed in further detail herein, the set of parameters associated with each object defines various characteristics of the virtual object, such as, for example, object geometric properties, material properties, physical properties, etc. An environment input module 220 is used to input or receive characteristics of an arbitrary environment into which the virtual objects will be mapped. In Further, a constraint input module 230 receives a set of constraints that define various relative relationships between virtual objects, parameters of those objects, and/or the environment Note that in various implementations, an optional user interface module 240 is used to define or select one or more of the virtual objects, parameters associated with one or more of those objects, various characteristics of the environment, and one or more constraints that define relationships between objects, parameters, and the environment.

Once all of the aforementioned inputs have been received (i.e., virtual objects, object parameters, environmental characteristics, and constraints), an initial layout module 250 is used to determine an initial layout that maps each virtual object into the environment. Note also that in various implementations, an initial layout can be specified via the user interface module 240. In either case, an iterative layout update module 260 then performs an iterative optimization of virtual objects layouts until either a global cost of the constraints is minimized or until a preset number of iterations has been reached. In various implementations, each iteration of this optimization process uses locally satisfiable proposals to simultaneously update and optimize the layout of all of the virtual objects relative to one or more of the other virtual objects, the characteristics of the environment, and the constraints. The resulting optimized layout of virtual objects is then provided by a layout output module to an application, game, etc., for use in real-time scene augmentation using virtual objects receiving a set of one or more virtual objects.

Note that in the case where one or more constraints are not subject to being locally satisfied, in various implementations, the Layout Optimizer is fully capable of using various sampling techniques that do not rely on locally satisfiable proposals to determine optimal layouts for one or more of the objects in the environment. Further, such techniques can be combined with the use of locally satisfiable proposals.

2.0 Operational Details of the Layout Optimizer:

The above-described program modules are employed for implementing various implementations of the Layout Optimizer. As summarized above, the Layout Optimizer provides various techniques for dynamically generating optimized layouts that map or embed virtual objects into environments. The following sections provide a detailed discussion of the operation of various implementations of the Layout Optimizer, and of exemplary methods for implementing the program modules described in Section 1 with respect to FIG. 1. In particular, the following sections provides examples and operational details of various implementations of the Layout Optimizer, including:

An operational overview of the Layout Optimizer;
Obtaining environmental characteristics of scenes;
Exemplary layout design for augmented reality (AR) applications;
Factor graph representation of constraints;
Adaptive layout considerations; and
Additional implementations and considerations.

2.1 Operational Overview:

As noted above, the Layout Optimizer-based processes described herein provide various techniques for dynamically generating optimized layouts that map or embed virtual objects into environments, including both 2D and 3D environments, and virtual and real-world environments (all collectively referred to herein as a scene). Consequently, the Layout Optimizer is operable with a wide range of computing and display devices. Further, Layout Optimizer can be used to augment or enhance still images, image sequences, recorded or live video feeds, etc. However, for purposes of explanation, the following discussion will generally frame the Layout Optimizer in the context of an augmented reality (AR) application or the like that uses declarative constraints to optimize the mapping or layout of multiple virtual objects to arbitrary environments.

The Layout Optimizer uses declarative constraints to formulate virtual object layout in arbitrary environments as a weighted constraint-satisfaction problem. This formulation incorporates both low-order and high-order interactions between objects and the environment. Low-order interactions are defined by constraints that relate to one or two layout constraints, such as, for example, a constraint stating that an object is to be placed on a vertical surface (such as a wall). Conversely, high-order interactions are defined by constraints that relate to potentially very large numbers of layout constraints. Such high-order interactions allow the Layout Optimizer to capture and control higher-order relationships between objects like co-linearity, co-planarity, equidistance, etc. Use of such constraints enables the Layout Optimizer to effectively, and realistically, augment arbitrary scenes (both real and virtual) with virtual objects. Note that these techniques also enable the Layout Optimizer to optimizing any of a wide range of object parameters or properties such as material (e.g., color, texture), pose, etc.

In various implementations, the Layout Optimizer uses hyper-graphs to represent the objects and constraints. Nodes in the graph represent objects and hyper-edges between nodes represent constraints that operate on objects. Direct computation of optimal layout solutions under a given hyper-graph involves minimization of a non-convex function, which, as an NP-hard problem, is generally considered infeasible.

Consequently, rather than attempt to compute direct solutions to NP-hard minimization problems, the Layout Optimizer uses an iterative process that is capable of estimating or approximating optimum layouts in real-time. For example, in various implementations, the Layout Optimizer uses an algorithm which takes as input a set of constraints, and encodes the resulting hyper-graph in a simple graph in which each node represents an object (and its properties) or an auxiliary node (used to represent complex relationships). The constraints define cost functions on the nodes and edges of the graph. In each iteration, the algorithm then generates candidate values for each object, and evaluates them simultaneously to find an approximate optimal layout (given the current set of candidates). This iterative process of this algorithm is based on the observation that for many types of constraints, satisfiable assignments can be found efficiently. In other words, these constraints are locally (individually) satisfiable, thus enabling the Layout Optimizer to generate layout proposals for objects that locally satisfy individual constraints while significantly reducing the need for blind sampling.

2.2 Obtaining Environmental Characteristics of Scenes:

The Layout Optimizer considers environmental characteristics of real or virtual 2D or 3D environments, including but not limited to images, empty spaces, rooms, structures, outdoor areas, etc., and any objects, people, plants, fluids, etc., in those environments. Further, any of the environmental characteristics may evolve or change over time. In various implementations, characteristics of the 2D or 3D environments are received via a user interface or the like from a library of existing environments. Alternately, or in combination, characteristics of the 2D or 3D environments are manually defined by a user. Alternately, or in combination, characteristics of the 2D or 3D environments are automatically determined using conventional automated scene evaluation techniques.

There is a wide range of well-known techniques that can be used to capture the characteristics of a 2D or 3D scene. Consequently, the details of capturing or deriving such characteristics scenes will not be described with specificity herein. For example, in various implementations, the Layout Optimizer uses existing hardware, such as, for example, a Kinect® device, to extract dense scene geometry for some arbitrary 3D space (referred to herein as the "scene" or the environment). The Layout Optimizer then further processes the scene to detect planar surfaces in that arbitrary 3D space, and to label those surfaces as vertical (e.g., walls, doors, windows, hanging pictures, etc.) or horizontal (e.g., floor, table, ceiling, etc.). Such planar features are common in indoor scenes and are useful to many applications.

Further, in various implementations, the Layout Optimizer incorporates additional existing detection and recognition capabilities, including, but not limited to object detection (e.g., furniture, plants, books, balls, people, animals, planar surfaces, corners, color pallet of the environment, lighting, passageways, windows, doors, etc.), recognizing previously visited rooms, etc. The environmental characteristics provided by these types of scene evaluation and recognition capabilities allows the Layout Optimizer to perform a real-time mapping of virtual objects to the arbitrary environments or scenes.

2.3 Layout Design for Augmented Reality Applications:

When designing constraint-based relative layouts for a scene, the Layout Optimizer provides the user with various mechanisms, such as a user interface or script input mechanism, which allow the user to specify a constraint-set using declarative programming to generate a constraint script or the like. Alternatively, or in combination, the user can select one or more constraints from a set of predefined constraints (e.g., a rule that places one or more specified virtual objects on a planar surface above the floor, a rule that places virtual objects on a curve with relative spacing, etc.).

In the case of scripts using declarative programming, virtual objects are selected or defined, with each object using a distinctive name and belonging to one of a number of predefined or user-defined classes. An object's class defines its properties, which may be initialized to a specific value. For each property, the Layout Optimizer defines a range of acceptable values, or defines it as fixed (not allowed to change in the optimization process). For example an object might have geometric properties such as position, facing (rotation) and scale, material properties (color, specularity), or physical properties (for physical simulations).

A simple script example (i.e., Sample Script 1) for a relative layout design is provided below, which defines two virtual objects ($X_1$, $X_2$), both of class $C_1$ (which includes object parameters). This script also includes constraints constraining $X_1$ to be on the floor (i.e., height on the Z-axis is 0) and facing towards $X_2$ which is above $X_1$ (with a height of $X_2$ on the Z-axis above $X_1$ exceeding 0.3 meters). The "environment" in this case is a local reference frame. Finally the constraints constrain the layout of $X_1$ and $X_2$ to include a clear line of sight between the objects (i.e., no intervening objects in the scene) and that the $X_1$ and $X_2$ are facing each other on the line of sight (with an alignment deviation from the line of sight limited to between 2 and 3 degrees on the X-axis, and between −0.01 and 0.01 degrees on the Y-axis) relative to anchor points resulting from the optimum layout of $X_1$ and $X_2$ determined by the Layout Optimizer:

---

Sample Script 1

---

```
// Object Definitions:
    ⟨X₁(C₁),X₂(C₁)⟩
// Object's Local Frame:
    // Position - Origin
    // X axis - Forward
    // Y axis - Right
    // Z axis - Up
// Height Difference:
    assert(Abs(LocalZ(X₁.Frame,X₂.Frame.Position )) > 0.3);
// Object on the Floor:
    assert(LocalZ(Floor.Frame,X₁.Frame.Position) = 0);
// X₁ is facing in the direction of X₂, regardless of height differences:
    assert(Between(LocaLX(X₁.Frame,X₂.Frame.Position), 2, 3));
    assert(Between(LocalY(X₁.Frame,X₂.Frame.Position), -0.01, 0.01));
// Line of sight between the anchor point of objects X₁ and X₂:
    assert(Visible(X₁.Frame.Position,X₁.Frame.Position) = 0);
```

---

Constraints can be presented in any of a variety of formats when creating a relative layout design of virtual objects relative to an arbitrary environment. However, for purposes of explanation, the following discussion will generally refer to the presentation of constraints using simple algebraic notation (such as Sample Script 1, shown above) and a library of predefined routines, either as cost functions or as Boolean conditions (in which case the Layout Optimizer automatically assigns a cost function). As noted above, a constraint can reference the properties of any of the objects defined, as well as the environment. For example when arranging objects in a room the user can reference the type of surface (or object) on which a virtual object is to be placed (horizontal, vertical, table, picture frame, etc.). Further, it should also be understood that any particular constraint may apply to one or more objects and/or the environment.

A simple example of a constraint is that objects of class C are to be placed on a horizontal surface (e.g., a floor or a tabletop) in a 3D environment. A simple example of a user-selectable customizable constraint is "Objects to maintain average spacing of x meters from other objects of class $C_i$,", where the user selects this customizable constraint then enters or selects values for x and $C_i$. Another simple example of a constraint is that objects are to assume a particular color, texture, orientation, pose, etc., when positioned within some predefined or variable distance of one or more other objects or one or more environmental characteristics (e.g., objects near a blue wall in a scene turn yellow, objects maintain a minimum distance from a heat source such as a fire in a scene, etc.). Note that the aforementioned constraint examples are merely a few of the virtually limitless constraints that can be used to define relationships or interactions between any one or more objects and/or the environment. Note also that any number of constraints may be combined to enable highly complex interactions between objects and the environment when object layouts are being determined by the Layout Optimizer.

The number of objects included in a constraint classify it as unary (one object), binary (two objects) or multiple. The space of all possible assignments to the object's properties is referred to herein as the layout solution space. For example, Equation (1) defines a constraint-based cost function:

$$\mathrm{cost}(s) := \sum_i r_i(\hat{s}_i) \qquad \text{Equation (1)}$$

where $r_i$: $(O_i \subseteq O) \rightarrow \mathbb{R}$ is a cost function (constraint) operating on a subset of the objects, s∈S is a specific solution, and $\hat{s}_i$ is a slice of the solution containing only the objects in $O_i$. Typically, each constraint applies only to a small subset of the objects. Note that an optimal layout, as determined by the Layout Optimizer, is one that minimizes the overall cost of its constraints.

Figure 3:
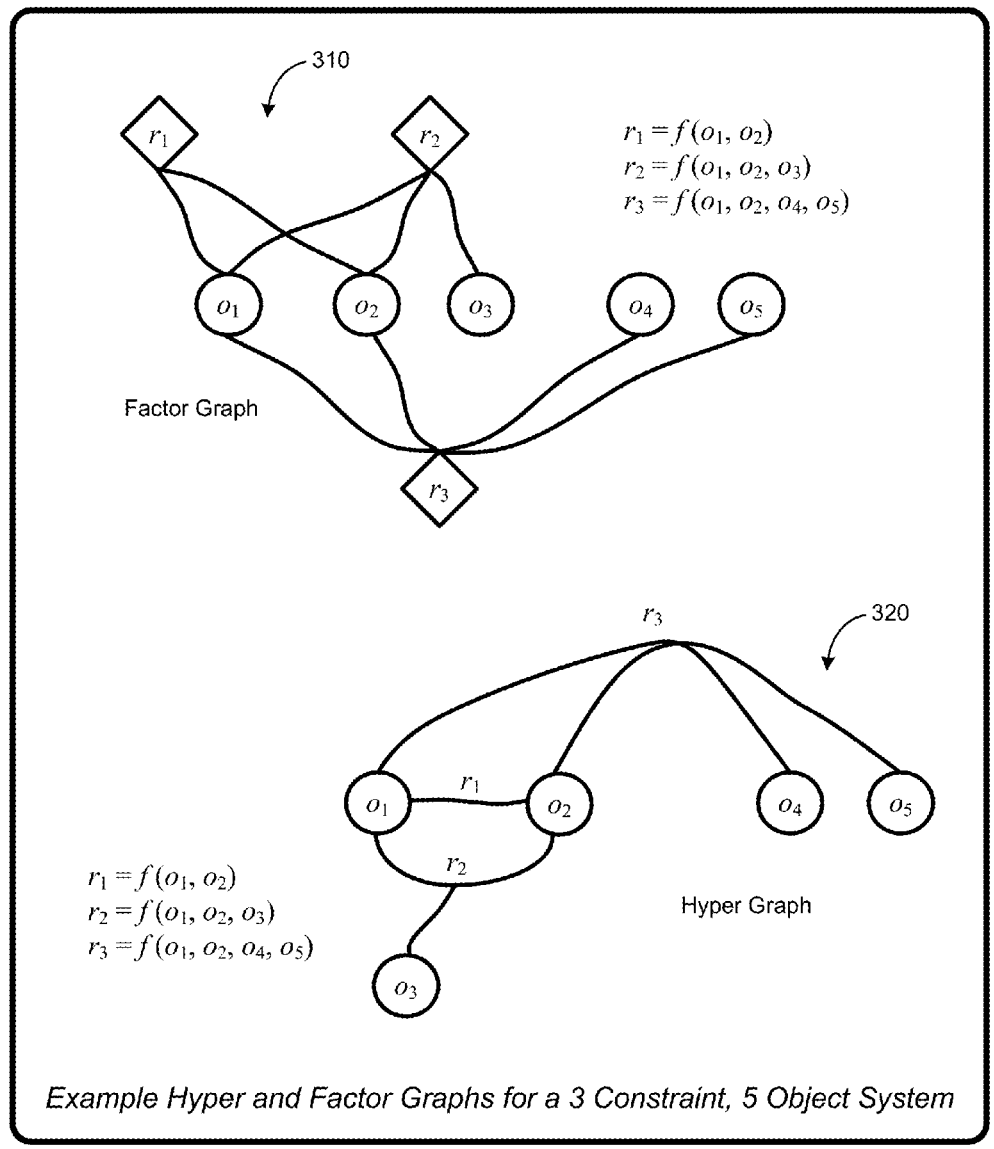
FIG. 3 provides an example of hyper graphs and factor graphs for a three constraint, five object relative layout design, as described herein.

2.4 Factor Graph Representation of Constraints:

A common graph representation for MAP (maximum a posteriori probability) problems is the Factor Graph that has two node groups: object nodes and factor (constraint) nodes. As illustrated by FIG. 3, edges in a Factor Graph 310 connect factors to the objects they reference. In general, FIG. 3 shows a simple relative layout design (in this case consisting of three constraints over five objects) represented as a Factor Graph 310 (i.e., a bipartite representation connecting object nodes to factor nodes). Alternatively, this relative layout design can be represented as a Hyper Graph 320 in which each node is an object, and an edge represents common constraints between connected nodes. Note that these types of graphs are described for purposes of explanation, and that the Layout Optimizer is not intended to be limited to the use of such graphs.

A factor representing a unary constraint will have one edge, a binary constraint will have two edges, and so on. The Layout Optimizer represents a relative layout design for object layout as a graph G=(V,E). Each object o has an associated node $v_o$ whose cost function is $\varphi(v_o)=\Sigma\{r|r:\{o\}\rightarrow \mathbb{R}\}$ (sum of all unary constraints on object o). The Layout Optimizer connects an edge e between $v_{o_1}$ and $v_{o_2}$ if there exists at least one constraint associated with these objects. Its cost function is $\psi_e=\Sigma\{r|r: \{o_1,o_2\}\rightarrow \mathbb{R}\}$. Given an assignment to all of the objects, the summed cost over the nodes and edges of the graph is equal to the cost of the resulting layout (i.e., Equation (1)). Note that a constraint may refer to more than two objects, and therefore an edge can connect more than two nodes, as illustrated by the Hyper Graph 320 of FIG. 2.

2.5 Adaptive Layout Considerations:

An optimal layout is the global minimum in the scalar field defined by the layout design cost function. Finding the optimal layout or even a good one is difficult: Constraint cost functions may be non-convex, constraints might be unsatisfiable, for example if they conflict with the environment or with themselves, therefore the lower bound on the cost is not known and it is difficult to specify a stopping criteria. Further, some rules are intentionally set to be unsatisfiable.

For example, to enable an object to be as big as it can inside a room, constraints may be used that specify that the object will be bigger than the room. While this constraint is not satisfiable, it will have the effect of forcing the Layout Optimizer to converge on a solution where the object is as large as possible in the room. Finally, the high-dimensional nature of the space and the assumed sparsity of feasible solutions reduce the effectiveness of stochastic sampling.

In general, the Layout Optimizer focuses on a discretized version of the solution space. Given N objects in the relative layout design and k possible layout assignments per object, the size of the solution space $k^N$ makes performing an exhaustive search prohibitively expensive. While the Layout Optimizer can sample from the underlying probability distribution function, using techniques such as the Metropolis-Hastings algorithm coupled with concepts from simulated annealing, such methods tend to use a very large number of samples and evaluations of the cost function, therefore requiring a long run time or reliance on massively parallel GPU implementations. Consequently, in various implementations, the Layout Optimizer significantly reduces computational overhead by reducing the number of evaluations used to find a feasible solution for optimized layouts. These techniques are discussed in detail in the following paragraphs.

Figure 4:
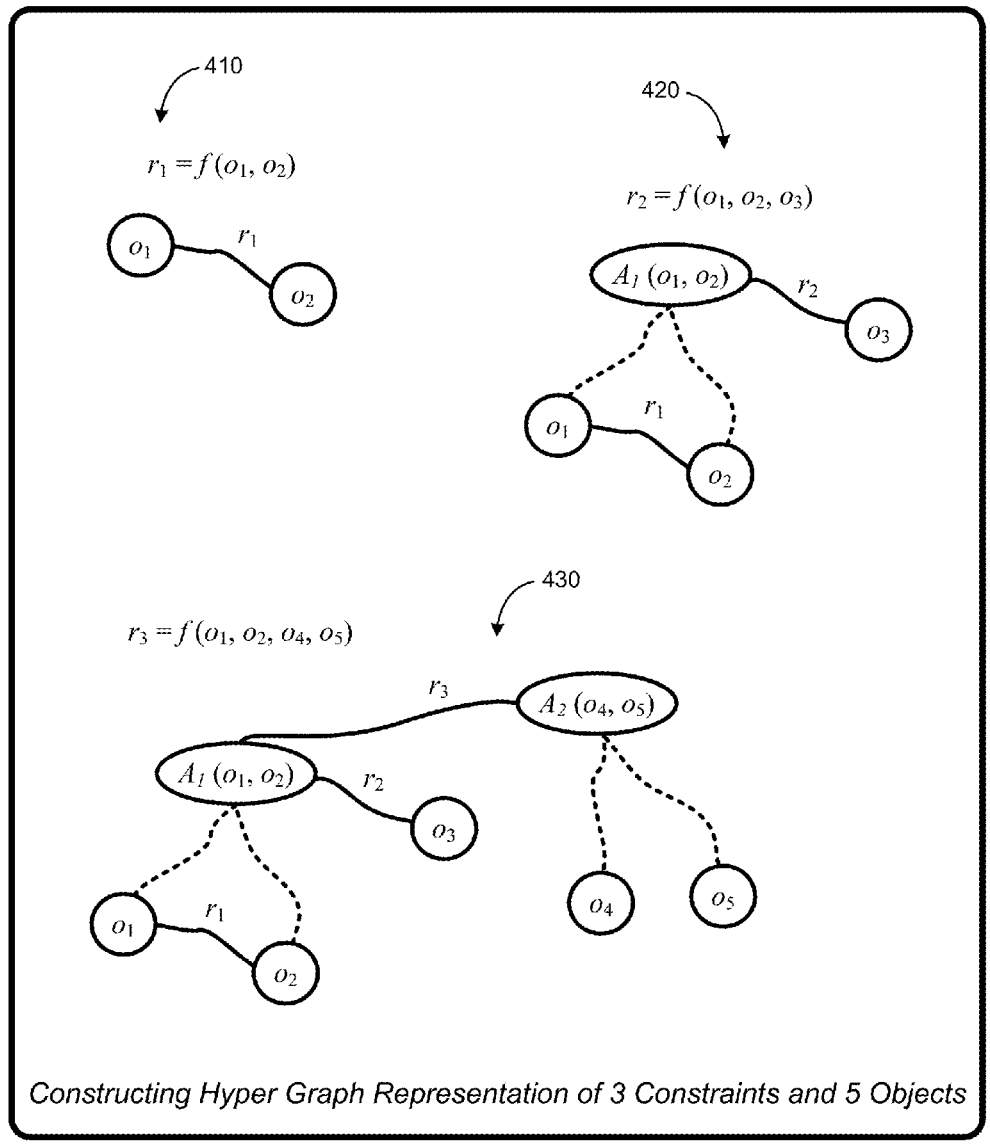
FIG. 4 provides an example of construction of a hyper graph for a three constraint, five object relative layout design, as described herein.

2.5.1 Transforming High-Order Constraints into Pairwise Interactions:

As illustrated by FIG. 4, to simplify the graphical representation of the relative layout design, the Layout Optimizer transform hyper-edges into pairwise graph interactions by introducing auxiliary nodes (see progression from graph 410 to graph 420 to graph 430). In particular, the Layout Optimizer divides the set of objects associated with any hyper-edge e into two groups $A_1$ and $A_2$. For each group consisting of more than one object, the Layout Optimizer adds an auxiliary node that represents the variables i.e., the value assigned to the auxiliary node encodes the value assigned to all objects represented by this node. If the group contains only one node, then the Layout Optimizer just uses the original object node.

The auxiliary node can only takes values in the space of assignments that satisfy the constraints that operate on the group of variables. Therefore, there is zero cost for assigning a particular feasible value to the auxiliary node, i.e., $\varphi(A_i)=0$ (no unary cost). The Layout Optimizer connects the two group nodes with an edge $\hat{e}$ such that $\psi_{\hat{e}} = \psi_e$. The Layout Optimizer then connects auxiliary nodes with their associated object nodes. The cost function for these edges $\psi(\{o, A_i\})$ is 0 if the assignment to object o matches the assignment to $A_i$ and arbitrarily high otherwise. The addition of the auxiliary variables ensures that there are only binary interactions between nodes. Formally, this corresponds to the following cost function:

$$E(x) = \sum_{i \in V} \phi_i(x_i) + \sum_{ij \in E} \psi_{ij}(x_i, x_j) \quad \text{Equation (2)}$$

where V and E represents the set of nodes and the set of edges between these nodes respectively, $x_i$ represents the label taken by a particular node, and $\varphi_i$ and $\psi_{ij}$ are functions that encode unary and pairwise costs. The second graph of FIG. 4 (i.e., graph 420) demonstrates how constraint $r_2$ that operates on $o_1$, $o_2$ and $o_3$ is represented by introducing the auxiliary node $A_1$. The function is then associated with the edge between group nodes $(A_1, o_3)$, as illustrated by the third graph of FIG. 4 (i.e., graph 430), which shows the addition of constraint $r_3$, the reuse of $A_1$, the addition of node $A_2$, and a connection between $A_1$ and $A_2$ via constraint $r_3$.

2.5.2 Adaptive Layout Space Exploration:

A simple method to find a low-cost solution under the function defined in Equation (2) is to explore the solution space by local search, i.e., start from an initial solution and proceed by making a series of changes which lead to solutions having lower energy (i.e., lower cost). At each step, this move-making algorithm explores the neighboring solutions and chooses the move that leads to the solution having the lowest energy. The algorithm is said to converge when no lower energy solution can be found. An example of this approach is the Iterated Conditional Modes (ICM) algorithm that at each iteration optimizes the value of a single variable keeping all other variables fixed. However, while this approach can be used by the Layout optimizer, it is not particularly efficient due to the large label space of each variable.

Consequently, in various implementations, the Layout Optimizer performs alternate processes, including, but not limited to, the use of a random walk algorithm, wherein in each iteration the Layout Optimizer selects a new value for one of the objects and evaluates the cost function. The Layout Optimizer then accepts the new configuration with a high probability if the cost improves. In other implementations, the Layout Optimizer further improves performance by modifying the way that proposals (i.e., proposed object layouts) are generated for each iteration.

For example, a straightforward approach is to sample uniformly over the object properties. Another approach is to start with uniform sampling (large steps) and, over time, reduce step size, sampling normally around the previous object value. One such algorithm based on simulated annealing is parallel tempering, whose effectiveness relies on a highly-parallel GPU setup. In this approach locally sampled moves are interspersed with switching values between objects and optimizing multiple solutions in parallel. In scenarios where objects might have a large number of properties (high dimensionality of layout space), objects might be of different classes (thus having different properties) and a highly parallel GPU might not be available. As such, in various implementations, discussed in further detail below, the Layout Optimizer provides a process that quickly converges to an optimal layout solution using relatively little computational overhead.

2.5.3 Exponential-Sized Search Neighborhoods:

It has been observed that using bigger moves (sampling in a larger neighborhood) when proposing object layouts in each iteration increases the probability that the local search algorithm of the Layout Optimizer will reach an optimal solution. This observation has been formalized in a way that gives bounds on the error of a particular move-making algorithm as the size of the search space increases. Further, for many classes of energy functions, graph cuts allow the computation of the optimal move in a move space whose size is exponential in the number of variables in the original function minimization problem. These move making algorithms can be used to find solutions that are strong local minima of the energy (i.e., minimum cost layouts for virtual objects).

In various implementations, the Layout Optimizer uses a fusion-move method that allows for the minimization of functions defined over continuous variables. In general, fusion-move techniques generalize graph cut approaches in a way that allows them to be used as building blocks within a broader variety of optimization processes by using graph cuts to combine pairs of suboptimal labelings or solutions. The fusion-move algorithm starts from an initial labeling of all the variables. In every iteration of the algorithm, the algorithm proposes a new labeling for all variables (i.e., new layouts or values for each variable). It then chooses, for each variable, whether to retain its previous label or to take the new proposed label. This binary choice problem is solved for all variables simultaneously using graph cuts.

In various implementations, the Layout Optimizer further generalizes the above-mentioned algorithms such that, in each iteration, instead of proposing a single new labeling for each variable, it proposes multiple new labels for each variable. Further, in contrast to range-move algorithms that propose particular ranges of labels, the Layout Optimizer uses arbitrary sets of labels for every variable that are automatically selected such that they satisfy all the constraints that apply on them. In addition, in contrast to existing range-move algorithms, the Layout Optimizer adaptively selects the number of variables included in the move. In this way, the Layout Optimizer can automatically smoothly explore the whole spectrum of choices between iterated conditional modes on one end (where only one variable is selected), and the full multi-proposal fusion move, which involves changing the label of all variables.

2.5.4 Solving a Single Iteration:

The Layout Optimizer formulates the problem of jointly selecting optimal layout proposals for all variables that satisfy the most constraints as a discrete optimization problem. More formally, let $P_i = \{p_i^1, p_i^2, \ldots, p_i^k\}$ be a set of k proposed configurations or layouts for object $x_i$. The Layout Optimizer introduce indicator variables $t_i^l$, $\forall i \in V$, $\forall l \in \{1 \ldots k\}$ where $t_i^l = 1$ indicates that object $x_i$ takes the properties in layout proposal l. Similarly, in various implementations, the Layout Optimizer makes use of binary indicator variables $t_{ij}^{lr}$, $\forall ij \in E$, $\forall l, r \in \{1 \ldots k\}$ where $t_{ij}^{lr} = 1$ indicates that objects $x_i$ and $x_j$ take the proposed layouts of proposal l and r respectively. Given the above notation, the optimum layout assignment can be computed by solving the following optimization problem:

$$\min \sum_{i \in V} \sum_l t_i^l \phi_i(p_i^l) + \sum_{ij \in E} \sum_{l,r} t_{ij}^{lr} \psi_{ij}(p_i^l, p_j^r) \quad \text{Equation (3)}$$

$$\text{s.t. } \forall i, \sum_l t_i^l = 1$$

$$\forall i, j, l, \sum_r t_{ij}^{lr} = t_i^l$$

$$\forall i, j, l, r t_i^l, t_{ij}^{lr} \in \{0, 1\}$$

The above optimization problem is considered NP-hard to solve. Consequently, instead of attempting a direct solution to this problem, the Layout Optimizer solves an LP-relaxation of Equation (3), and then rounds the fractional solution. For this purpose, the Layout Optimizer uses general-purpose linear programming solvers in various implementations. However, in further implementations, the Layout Optimizer uses a variation of a sequential tree re-weighted message passing algorithm (TRW-S) that efficiently solves the linear program by exploiting the sparse nature of the interactions between variables. TRW-S guarantees a non-decreasing lower bound on the energy. However, as part of the iterative process, the Layout Optimizer only updates the current solution if it improves upon the previous one.

The resulting process operates as illustrated by Algorithm 1, shown below. In particular, as shown in Algorithm 1, given a relative layout design, the Layout Optimizer first constructs a graph as described above in Section 2.5.1. Then, in each iteration, the Layout Optimizer generates a set of candidates for all objects to be optimized (i.e., Objects_To_Optimize). In relative layout designs with many objects (e.g., over 20), the Layout Optimizer optimizes a different random subset of objects in each iteration to reduce the complexity of the graph. In Propose_Candidates the Layout Optimizer uses a combination of random sampling and locally-satisfiable proposals (also referred to herein as an "LSP", as discussed in further detail in Section 2.5.5, below) to generate k candidates for each active object.

The Layout Optimizer evaluates the cost of each constraint, and for the tuples of values associated with it. Therefore, a unary constraint is evaluated k times, a binary constraint $k^2$ times, and so on. These costs are transferred to the graph nodes and edges as described above. Note that for complex constraints, this creates a challenging number of evaluations, which can go up to $k^n$ (where n is the number of objects in the relative layout design). It has been observed that limiting the set of candidates for auxiliary nodes to O(k) tuple values did not reduce the efficiency of the algorithm, and kept the complexity at $O(nk^2)$.

The Layout Optimizer then attempts to find an improved layout assignment for the objects, based on the populated graph, using TRW-S. In each iteration, given that the Layout Optimizer accepts the new solution (based on its cost and temperature of the system), the Layout Optimizer saves the new solution and further reduces the temperature (which also reduces the radius of the sampling radius). The Layout Optimizer repeats for a fixed number of iterations, or until the current accepted solution is beneath a minimum cost.

Algorithm 1

```
procedure Large_Moves (O, R), where O is the Objects and R is the
Constraints
    G ← Construct_Graph(O, R)
    min_Solution ← Random_Assignment(O) (alternate user specified
    solution)
    min_Cost ← Evaluate (min_Solution)
    for j ← 1, n_iterations do
        A ← Objects_To_Optimize(G, current_Solution)
        for all o_i ∈ A do
            P_i ← Propose_Candidates(o_i)
        end for
        for all r ∈ R do
            Update_Graph_Costs (G, Evaluate (r,{P_1, P_2, ...}))
        end for
        current_Solution ← TRW S(G)
        cost ← Evaluate(current_Solution)
        if Accept(cost, min_Cost) then
            min_Solution ← current_Solution
            min_Cost ← cost
        end if
    end for
end procedure
```

2.5.5 Locally Satisfiable Proposals (LSP):

The space of possible values (e.g., position, color, etc.) of an object is very large and it may require an extremely large number of layout proposals to obtain an optimal layout assignment. The Layout Optimizer overcomes this problem by guiding the mechanism through which new layout proposals are generated. For many types of constraints, assignments that satisfy these constraints can be found efficiently. In other words, these constraints are locally satisfiable. In simple terms, given a layout assignment to some of the objects referenced by constraint r the Layout Optimizer can generate optimal layout proposals for the rest, without resorting to blind sampling in the layout solution space. This approach could be seen as performing Gibbs sampling, taking advantage of a partial probability function, to sample from the whole solution space. A few examples are presented below for purposes of explanation, however, it should be understood that the Layout Optimizer is not limited to the following locally satisfiable constraint examples, and that any desired constraint-based relationship can be defined for such purposes:

1. dist(a,b)<4 is locally satisfiable as given a, as the Layout Optimizer generates layout proposals for object b within the circle centered on object a with radius 4.
2. collinear($x_1, \ldots x_n$) is locally satisfiable given layout assignments to two of the objects, as the Layout Optimizer can sample the rest of the objects on the line defined between those two objects.
3. within_Frustum(a) sets object a to be in the camera frustum. This is locally satisfiable, as it will generate layout proposals for object a that are limited to a slice of the 3D space corresponding to the frustum.
4. complementary(a,b) provides a constraint on the material properties of two objects (i.e., complementary colors). This constraint is locally satisfiable, as given the color of object a, the color of object b is easy to calculate.

When a user sets constraints in the declarative language, he can define a constraint as locally satisfiable. Further, in various implementations, each such constraint has an "inverse" function that generates layout proposals for the constraint-referenced objects, given one or more object assignments. It has been observed that many layout designs contain relatively simple geometric constraints, which are very often locally satisfiable.

A locally satisfiable proposal (LSP) is a layout candidate or proposal for object o that was proposed by a locally satisfiable constraint r. In various implementations, the Layout Optimizer generates LSP's using a greedy strategy. For example, given a hyper-graph structure of the relative layout design, the Layout Optimizer applies a BFS (i.e., a "best-first search") starting from a randomly selected node. Then, as the Layout Optimizer discovers new nodes, the Layout Optimizer generates an LSP for the newly discovered nodes, based on the nodes already visited, and the edges by which the Layout Optimizer discovers these nodes. For example consider the following constraints applied to objects $o_1, o_2, o_3, o_4$:

$$\text{dist}(o_1,o_2)=\text{dist}(o_1,o_3)=\text{dist}(o_1,o_4)>1 \qquad \text{Equation (4)}$$

which is, in essence, a circle of some radius around $o_1$. A greedy LSP generation can proceed by selecting $o_4$ and randomly sampling a position for it. Then, the Layout Optimizer chooses the constraint dist($o_1,o_4$)>1 and selects a candidate for $o_1$ at a distance of at least 1 from $o_4$. Next, given positions for $o_1$ and $o_4$, candidates for $o_2$ and $o_3$ are generated on the imaginary circle of radius dist($o_1,o_4$). Repeating this algorithm creates a series of greedy assignments, which, in various implementations, are interspersed with normal sampling, to produce the full candidate set which is then evaluated by the Layout Optimizer.

2.6 Example Object Layouts:

As described in detail above, the Layout Optimizer uses a constraint-based relative layout design framework, which, in various implementations, also uses locally satisfiable proposals to guide a move-making algorithm that results in an optimum layout for virtual objects in a environment.

Section 2.6.1 provides an example of three different three constraint sets (i.e., layout design problems).

Figure 5:
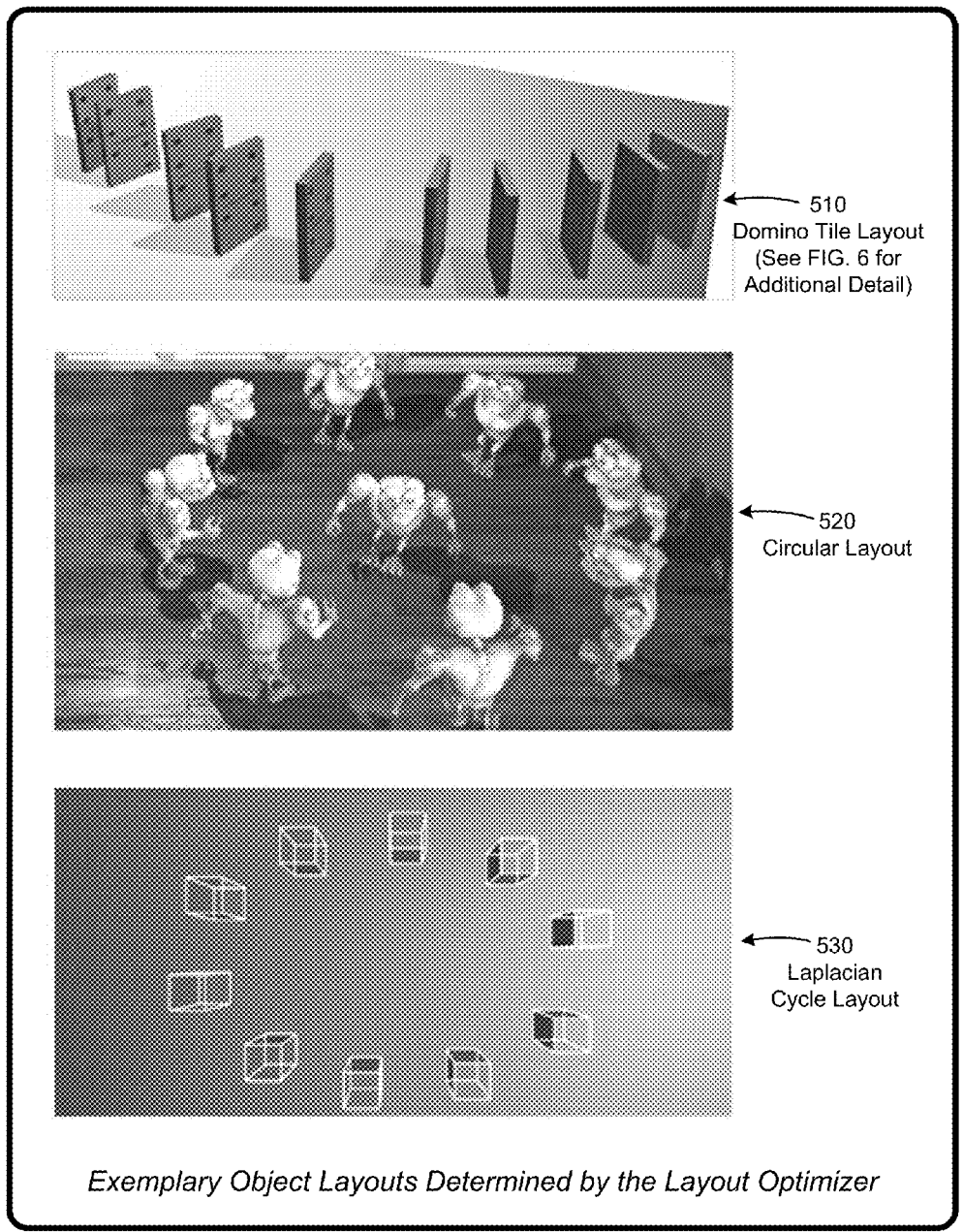
FIG. 5 provides several exemplary objects determined by the Layout Optimizer using various constraint-based relative layout designs, as described herein.

2.6.1 Example Constraint Sets for Various Relative Layout Designs:

Relative layout designs differ in the type and number of constraints they contain, and by how constrained the solution is. These differences are reflected in the underlying graph structure, and in the ability of the Layout Optimizer to create locally satisfiable proposals. In each of the three relative layout designs described below, the constraints are geometric (though there is no requirement for the use of geometric constraints in any relative layout design), and each object in the relative layout design can be assigned position, rotation and scale in 2D. Note that FIG. 5 provides an illustration of each of the following layouts. In particular, a domino tile layout 510 is illustrated that shows domino tiles arranged in a curve. Note that the process for achieving the domino tile layout 510 is further illustrated by FIG. 6. In addition, FIG. 5 illustrates a circular layout 520 of objects that shows multiple instances of a single object class (e.g., poseable creature models) arranged in a circle around a single one of those objects positioned at the center of the circle. Finally, an arrangement of objects in a Laplacian cycle 530 is also illustrated by FIG. 5.

Domino: The domino tile layout 510 of FIG. 5 shows a short segment of thirty tiles arranged in a curve, where each tile $t_i$ is subject to the following constraints:

$$2<\text{dist}(t_i,t_{i+1})<5 \qquad (i)$$

$$(t_{i+1}-t_i,t_{i+1}\cdot\text{facing})\leq 0.97 \qquad (ii)$$

$$(t_{i+1}\cdot\text{facing},t_i\cdot\text{facing})\leq 0.9. \qquad (iii)$$

Figure 6:
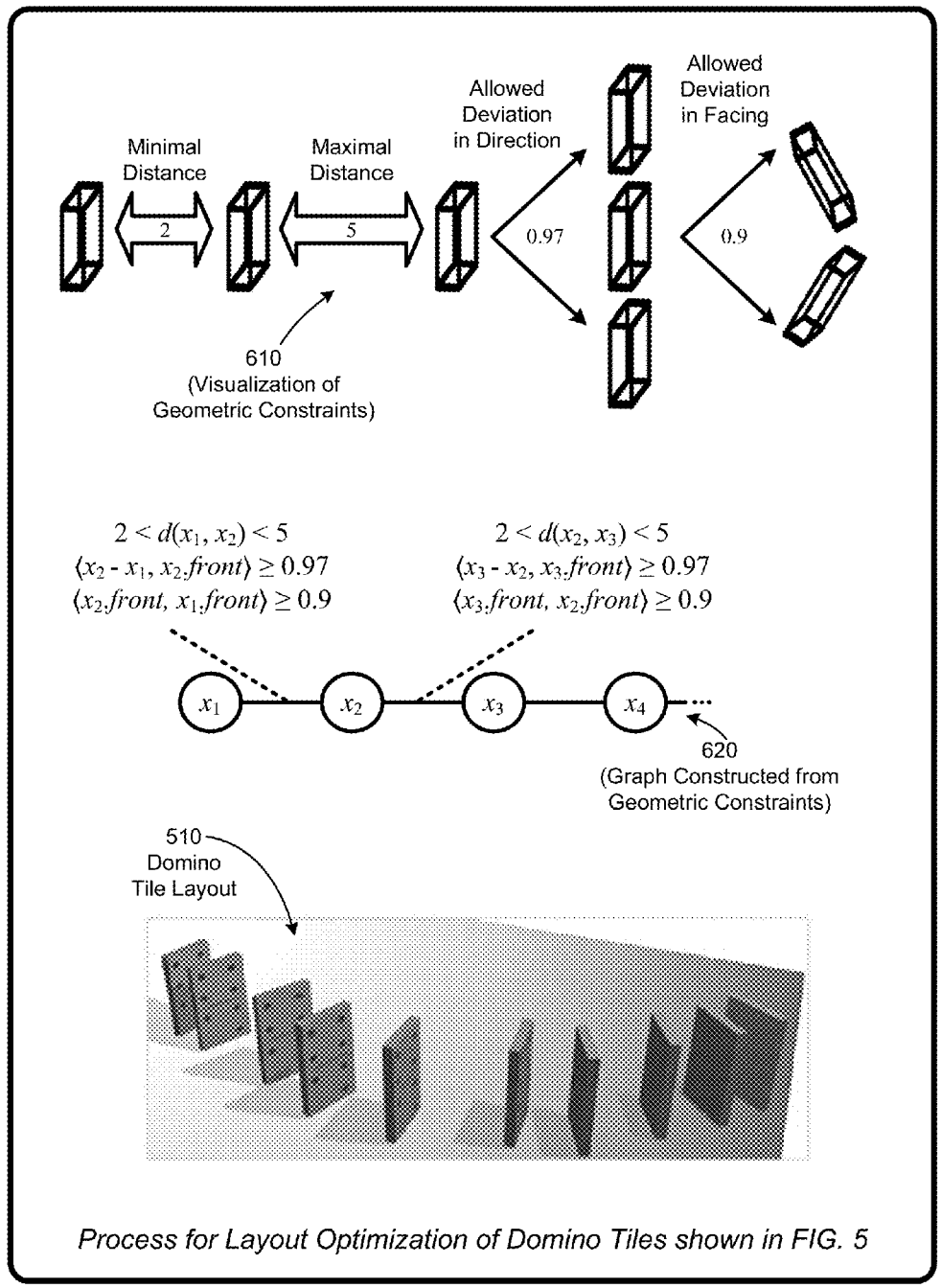
FIG. 6 provides an illustration of the process for layout optimization of domino tiles using a constraint-based relative layout design, as described herein.

FIG. 6 provides a conceptual illustration of the process used by the Layout Optimizer to perform the layout optimization of the domino tiles shown in FIG. 5. In particular, a visualization of the geometric constraints 610 is shown. The resulting graph 620 that is constructed for the constraints is a chain structure that is optimally solved by belief propagation algorithms such as TRW-S. Finally, FIG. 6 repeats the resulting domino tile layout 510 originally illustrated in FIG. 5.

Circle: Returning to FIG. 5, the circular layout 520 shows the capability of the Layout Optimizer to handle a highly connected graph with cycles. In particular, in this example, the Layout Optimizer makes use of a relative layout design for nine objects arranged in a circle (with non-fixed radius) around a central object. The constraints for this relative layout design include a minimal angle between any two objects of at least 25°. Note that the constraints in this relative layout design are ternary, and that the constraints enforcing a minimal angle between all objects create a graph with high connectivity.

Laplacian Cycle: Finally, the use of the LSP processes of the Layout Optimizer are demonstrated by the use of the Laplacian cycle layout 530. In this example, the Layout Optimizer uses the constraints of a relative layout design to arrange ten objects $t_1 \ldots t_{10}$ such that $t_i=(t_{i-1}+t_{i+1})/2$ and dist($t_i, t_{i+1}$)>Y (where Y is some constant). Since the constraints wrap around $t_{10}$ (e.g., $t_1=(t_{10}+t_2)/2$) the cost can never be 0 and the best possible solution is a least-squares oval structure, as illustrated by the Laplacian cycle layout 530 of FIG. 5. In this scenario, where local layout proposals will never lead to a least-squares solution. However, since in every iteration, Algorithm 1 also performs some random moves, the performance of the Layout Optimizer has been observed to converge to an optimal layout solution.

2.7 Additional Implementations and Considerations:

The following paragraphs provide examples and discussion of various additional implementations and considerations regarding use and implementation of the Layout Optimizer.

2.7.1 Photo Overlays:

As noted above, the Layout Optimizer is applicable for use in arbitrary 2D and 3D environments. For example, an image, photograph, document, web page, etc., is considered by the Layout Optimizer to be a 2D environment. Further, as noted above, virtual objects include text or advertisements. As such, the Layout Optimizer is well suited for use in adding arbitrary content (i.e., virtual objects) to 2D environments, such as, for example, performing an automated optimization of the layout of multiple text items in an image.

In the case of photo overlays (e.g., text objects in this example), the Layout Optimizer is adapted to perform 2D layout design of text objects as overlays in an image in a way that avoids covering salient regions of the image. For example, when reviewing a collection of photographs, it is often useful to see the corresponding meta-data (e.g., title, date, exposure information, geo-tags, user supplied tags, etc.) alongside the original image. In smaller form-factors, there is often not enough screen real estate to display the image alongside this type of information. Advantageously, the Layout Optimizer provides automated layout of such information based on geometrical and aesthetic design constraints.

In this example, the objects in the design are the different textual and visual elements to be superimposed or overlaid on the image, and the environment is the image. Given an image, the Layout Optimizer either receives a set of user provided text or image-based overlays, or extracts textual meta-data from the image's EXIF, including, but not limited to, title, camera and lens model, aperture, shutter speed, information for computing a luminance histogram, etc. The Layout Optimizer then uses any of a number of existing well-known techniques to calculate a saliency map from the image, run an edge detection filter and extract a color palette of the image.

The relative layout design constraints employed by the Layout Optimizer are such that the superimposed elements are positioned on the non-salient regions in the image, with the colors of those elements being assigned to each element from the extended color palette of the image. Additionally, the relative layout design constraints specify that the title is larger than the exposure information, and the exposure information elements are ordered vertically and attempt to align (left or right depending on their position within the image).

Figure 7:
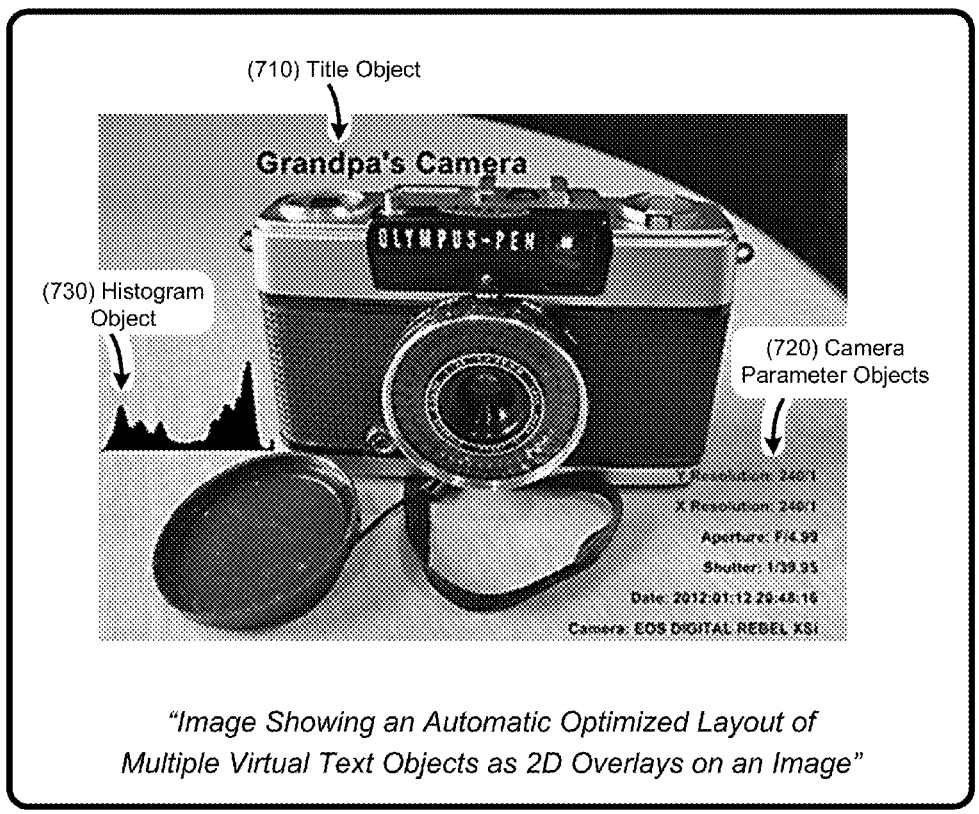
FIG. 7 provides an image showing an automatic optimized layout of multiple virtual text objects as 2D overlays on that image, as described herein.

FIG. 7 provides a simple example such implementations. In particular, FIG. 7 shows a title object 710 overlaid above a picture of a camera, and having larger text than other overlays on the picture. Additional overlays include multiple camera parameter objects 710 (i.e., virtual text objects), which in this example include a camera Y resolution object, a camera X resolution object, an aperture object, a shutter speed object, a date object, and a camera model object. In addition, FIG. 7 also shows a histogram object 720 computed from the image data by the Layout Optimizer. Notice that none of the virtual objects (710, 720, and 730) is overlaid on salient portions of the image. Advantageously, no user input is required in this example, except for selection of the image and optional title input (if a title is not already embedded in the image EXIF file). However, if desired, the user can adjust any or all of the constraints of the relative layout design, or simply select from any of a number of predefined relative layout designs having predefined constraints.

2.7.2 Other Use Examples:

The following discussion summarizes a few examples of the many layout uses and scenarios enabled by the Layout Optimizer. It should be understood that the following examples are provided only for purposes of illustration and explanation and are not intended to limit the scope of the Layout Optimizer to the examples discussed.

In various implementations, the Layout Optimizer is used to optimize animations of virtual characters to fit a specific environment (e.g., rooms, indoor or outdoor surfaces or spaces, objects in or on those rooms, surfaces or spaces, characteristics such as light sources in those rooms, surfaces, or spaces, etc.). For example, as discussed above, FIG. 1 illustrates both fixed and animated objects (i.e., the fixed virtual racetrack object and the animated virtual race car object moving on the racetrack). Similarly, although FIG. 5 shows poseable creature models (520) in a fixed circular arrangement, these poseable creature models can be animated relative to each other and/or relative to the environment in which those poseable models are placed by the Layout Optimizer.

Further, in various implementations, the Layout Optimizer provides automatic layout of slides (e.g., presentation materials) using aesthetic design rules similar to those used with respect to the layout of objects relative to the camera image of FIG. 7. In such cases, the layout of one or more objects to be positioned (or animated) on a slide is automatically optimized by the Layout Optimizer according to whatever aesthetic design constraints are specified. Examples of such constraints may include, but are not limited to, automatically avoiding or minimizing obscuring text, images, or other objects on the slide, automatically sizing, positioning, rotating, skewing, etc., one or more objects relative to text, images, or other objects on the slide, etc.

An interesting extension to the above-described slide-based layouts is to use the Layout Optimizer to automatically determine optimized layouts or arrangements of content on a digital white board, television, computer display, etc., given design constraints such as, for example, co-alignment of paragraphs, non-overlapping text, backgrounds, transparency levels, etc.

The Layout Optimizer also enables various theater and stage effects. For example, in various implementations, the Layout Optimizer uses a 2D or 3D projector (or combinations of multiple 2D and/or 3D projectors) to project objects onto a stage, a screen, or other surface or space. The Layout Optimizer automatically positions these projections on the stage, screen or other surface or space with an optimum layout that is determined relative to the shape of the stage, screen or other surface or space, and relative to the positions of the actors or other real or virtual objects on the stage, screen or other surface.

An interesting extension to the above-described implementations is use the Layout Optimizer to display of possible furniture layouts within an existing building, house or room, or within an architectural model of a building, house, or room, given the current geometry, arrangements, lighting, etc., of the building, house, or room.

Other uses of the Layout Optimizer include automatically augmenting a landscape. In such cases, the actual landscape can be augmented via projections (similar to the theater and stage projections discussed above), or an image of the landscape can be augmented by use of automatically generated objects such as models or images of cars, people, animals, houses, buildings, streets, neighborhood infrastructure (e.g., street lights, telephone poles, mail boxes, etc.), plants or other landscaping, etc. Note that in the case of large outdoor areas or landscapes, existing landscape models or models constructed using various imaging or LIDAR-based techniques may be used by the Layout Optimizer as the canvas on which objects are arranged in accordance with any associated constraints.

Figure 8:
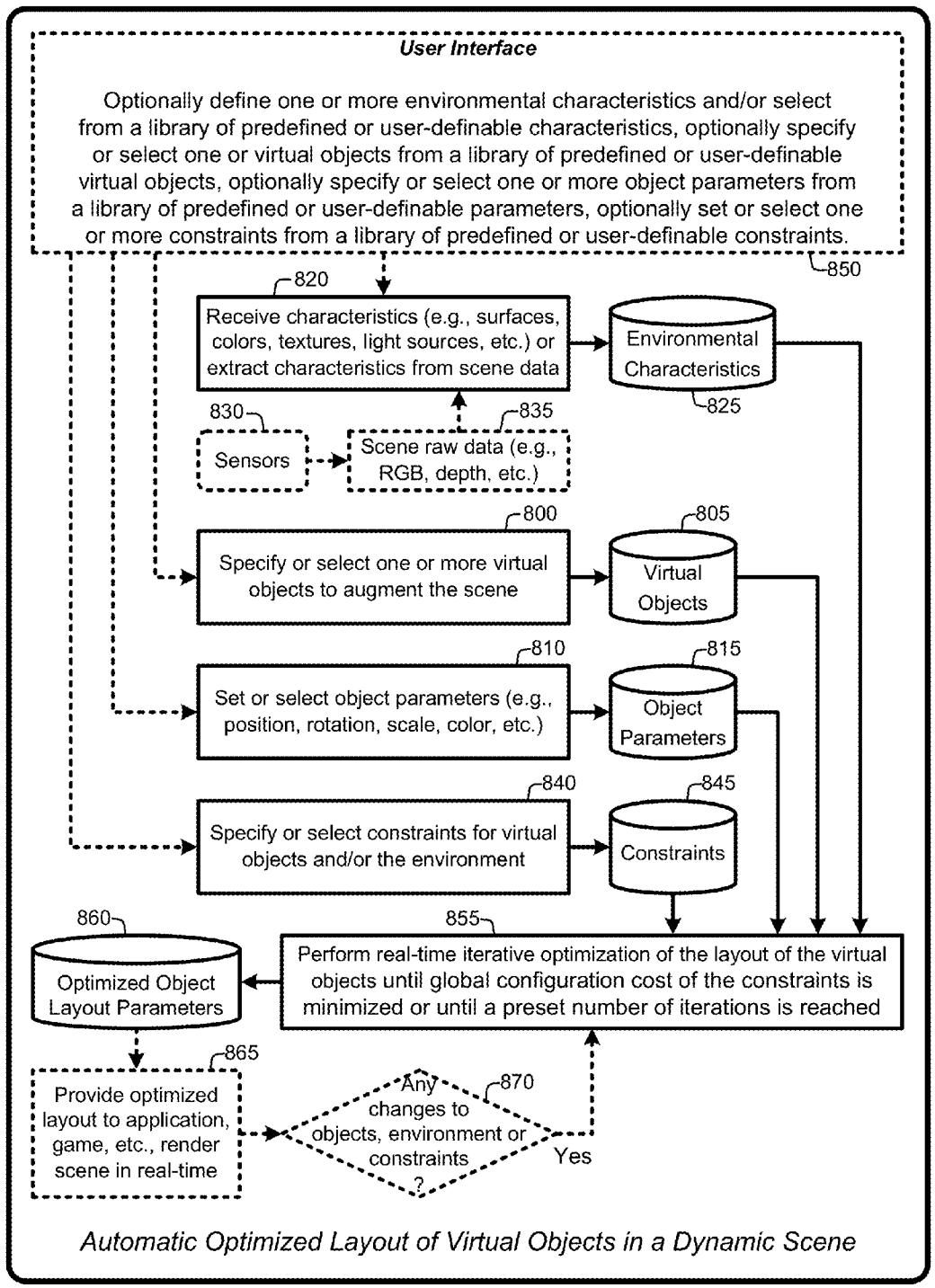
FIG. 8 illustrates a general system flow diagram that illustrates exemplary methods for implementing various implementations of the Layout Optimizer, as described herein.

3.0 Operational Summary of the Layout Optimizer:

The processes described above with respect to FIG. 1 through FIG. 7, and in further view of the detailed description provided above in Sections 1 and 2, are illustrated by the general operational flow diagram of FIG. 8. In particular, FIG. 8 provides an exemplary operational flow diagram that summarizes the operation of some of the various implementations of the Layout Optimizer. Note that FIG. 8 is not intended to be an exhaustive representation of all of the various implementations of the Layout Optimizer described herein, and that the implementations represented in FIG. 8 are provided only for purposes of explanation.

Further, it should be noted that any boxes and interconnections between boxes that are represented by broken or dashed lines in FIG. 8 represent optional or alternate implementations of the Layout Optimizer described herein. In addition, any or all of these optional or alternate implementations, as described below, may be used in combination with other alternate implementations that are described throughout this document.

In general, as illustrated by FIG. 8, the Layout Optimizer begins operation by specifying (800) or select one or more virtual objects 805 to augment the scene. The Layout Optimizer then sets (810) or selects object parameters 815 (e.g., position, rotation, scale, color, etc.). In addition, the Layout Optimizer receives (820) environmental characteristics 825 (e.g., surfaces, colors, textures, light sources, etc.). Note that in various implementations, the Layout Optimizer extracts these environmental characteristics 825 from scene raw data 835 (e.g., RGB, depth, etc.) derived from one or more sensors 830. Further, the Layout Optimizer is used to specify (840) or select one or more constraints for one or more virtual objects 805 and/or the environmental characteristics 825.

Note that in various implementations, an optional user Interface 850 or the like allows the user to define one or more environmental characteristics and/or select from a library of predefined or user-definable characteristics, optionally specify or select one or virtual objects from a library of predefined or user-definable virtual objects, optionally specify or select one or more object parameters from a library of predefined or user-definable parameters, optionally set or select one or more constraints from a library of predefined or user-definable constraints.

Given the input of the virtual objects 805, the object parameters 815, the environmental characteristics 825 and the constraints 845, the Layout Optimizer then performs (855) real-time iterative optimization of the layout of the virtual objects until global configuration cost of the constraints is minimized or until a preset number of iterations is reached. The resulting optimized object layout parameters 860 are then optionally provided (865) to an application, game, etc., so that the layout information can be used to render a corresponding scene in real-time. Note that any changes (870) to objects, the environment or constraints will cause the Layout Optimizer to repeat the iterative layout optimization process.

Figure 9:
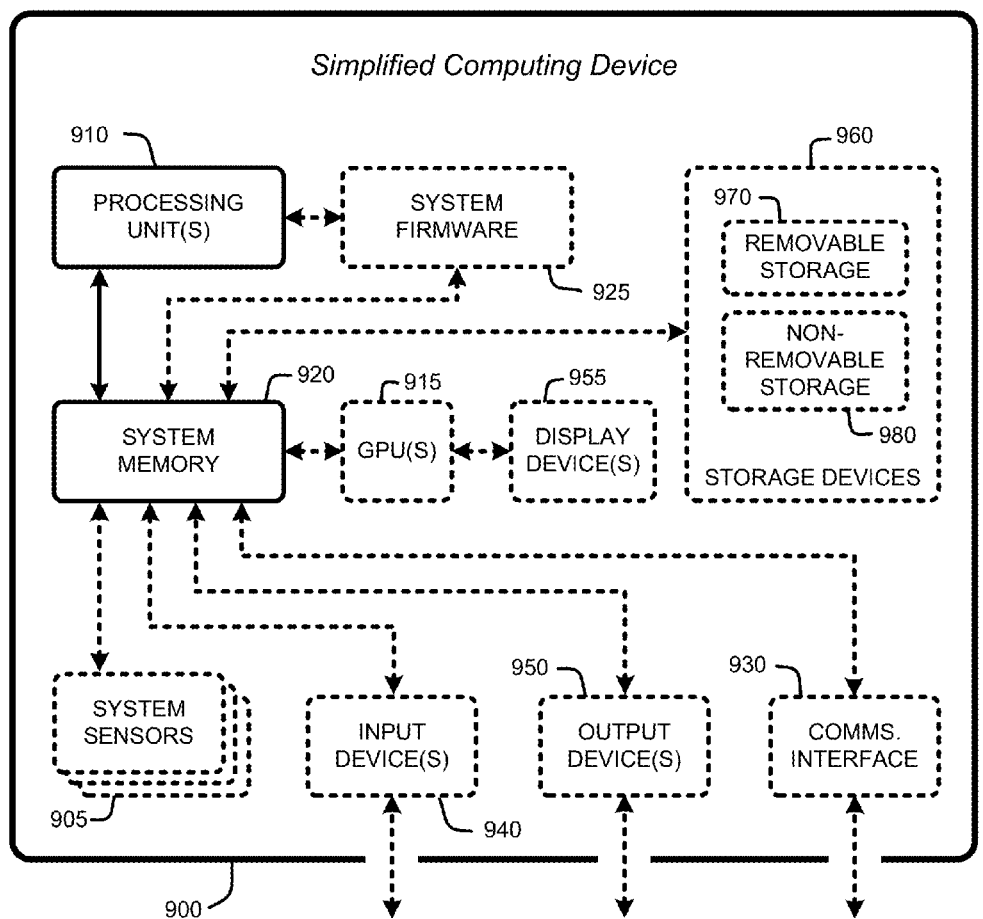
FIG. 9 is a general system diagram depicting a simplified general-purpose computing device having simplified computing and I/O capabilities for use in implementing various implementations of the Layout Optimizer, as described herein.

4.0 Exemplary Operating Environments:

The Layout Optimizer described herein is operational within numerous types of general purpose or special purpose computing system environments or configurations. FIG. 9 illustrates a simplified example of a general-purpose computer system on which various implementations and elements of the Layout Optimizer, as described herein, may be implemented. It should be noted that any boxes that are represented by broken or dashed lines in FIG. 9 represent alternate implementations of the simplified computing device, and that any or all of these alternate implementations, as described below, may be used in combination with other alternate implementations that are described throughout this document.

For example, FIG. 9 shows a general system diagram showing a simplified computing device 900. Examples of such devices operable with the Layout Optimizer, include, but are not limited to, portable electronic devices, wearable computing devices, hand-held computing devices, laptop or mobile computers, communications devices such as cell phones, smartphones and PDA's, multiprocessor systems, microprocessor-based systems, set top boxes, programmable consumer electronics, network PCs, minicomputers, audio or video media players, handheld remote control devices, etc. Note also that the Layout Optimizer may be implemented with any touchscreen or touch-sensitive surface that is in communication with, or otherwise coupled to, a wide range of electronic devices or objects.

To allow a device to implement the Layout Optimizer, the computing device 900 should have a sufficient computational capability and system memory to enable basic computational operations. In addition, the computing device 900 may include one or more sensors 905, including, but not limited to, accelerometers, cameras, capacitive sensors, proximity sensors, microphones, multi-spectral sensors, etc. Further, the computing device 900 may also include optional system firmware 925 (or other firmware or processor accessible memory or storage) for use in implementing various implementations of the Layout Optimizer.

As illustrated by FIG. 9, the computational capability of computing device 900 is generally illustrated by one or more processing unit(s) 910, and may also include one or more GPUs 915, either or both in communication with system memory 920. Note that that the processing unit(s) 910 of the computing device 900 may be a specialized microprocessor, such as a DSP, a VLIW, or other micro-controller, or can be a conventional CPU having one or more processing cores, including specialized GPU-based cores in a multi-core CPU.

In addition, the simplified computing device 900 may also include other components, such as, for example, a communications interface 930. The simplified computing device 900 may also include one or more conventional computer input devices 940 or combinations of such devices (e.g., touchscreens, touch-sensitive surfaces, pointing devices, keyboards, audio input devices, voice or speech-based input and control devices, video input devices, haptic input devices, devices for receiving wired or wireless data transmissions, etc.). The simplified computing device 900 may also include other optional components, such as, for example, one or more conventional computer output devices 950 (e.g., display device(s) 955, audio output devices, video output devices, devices for transmitting wired or wireless data transmissions, etc.). Note that typical communications interfaces 930, input devices 940, output devices 950, and storage devices 960 for general-purpose computers are well-known to those skilled in the art, and will not be described in detail herein.

The simplified computing device 900 may also include a variety of computer readable media. Computer readable media can be any available media that can be accessed via storage devices 960 and includes both volatile and nonvolatile media that is either removable 970 and/or non-removable 980, for storage of information such as computer-readable or computer-executable instructions, data structures, program modules, or other data. By way of example, and not limitation, computer readable media may comprise computer storage media and communication media. Computer storage media refers to tangible computer or machine readable media or storage devices such as DVD's, CD's, floppy disks, tape drives, hard drives, optical drives, solid state memory devices, RAM, ROM, EEPROM, flash memory or other memory technology, magnetic cassettes, magnetic tapes, magnetic disk storage, or other magnetic storage devices, or any other device which can be used to store the desired information and which can be accessed by one or more computing devices.

Storage of information such as computer-readable or computer-executable instructions, data structures, program modules, etc., can also be accomplished by using any of a variety of the aforementioned communication media to encode one or more modulated data signals or carrier waves, or other transport mechanisms or communications protocols, and includes any wired or wireless information delivery mechanism. Note that the terms "modulated data signal" or "carrier wave" generally refer a signal that has one or more of its characteristics set or changed in such a manner as to encode information in the signal. For example, communication media includes wired media such as a wired network or direct-wired connection carrying one or more modulated data signals, and wireless media such as acoustic, RF, infrared, laser, and other wireless media for transmitting and/or receiving one or more modulated data signals or carrier waves. Combinations of the any of the above should also be included within the scope of communication media.

Retention of information such as computer-readable or computer-executable instructions, data structures, program modules, etc., can also be accomplished by using any of a variety of the aforementioned communication media to encode one or more modulated data signals or carrier waves, or other transport mechanisms or communications protocols, and includes any wired or wireless information delivery mechanism. Note that the terms "modulated data signal" or "carrier wave" generally refer to a signal that has one or more of its characteristics set or changed in such a manner as to encode information in the signal. For example, communication media includes wired media such as a wired network or direct-wired connection carrying one or more modulated data signals, and wireless media such as acoustic, RF, infrared, laser, and other wireless media for transmitting and/or receiving one or more modulated data signals or carrier waves. Combinations of the any of the above should also be included within the scope of communication media.

Further, software, programs, and/or computer program products embodying the some or all of the various implementations of the Layout Optimizer described herein, or portions thereof, may be stored, received, transmitted, or read from any desired combination of computer or machine readable media or storage devices and communication media in the form of computer executable instructions or other data structures.

Finally, the Layout Optimizer described herein may be further described in the general context of computer-executable instructions, such as program modules, being executed by a computing device. Generally, program modules include routines, programs, objects, components, data structures, etc., that perform particular tasks or implement particular abstract data types. The implementations described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

The foregoing description of the Layout Optimizer has been presented for the purposes of illustration and description. It is not intended to be exhaustive or to limit the claimed subject matter to the precise form disclosed. Many modifications and variations are possible in light of the above teaching. Further, it should be noted that any or all of the aforementioned alternate implementations may be used in any combination desired to form additional hybrid implementations of the Layout Optimizer. It is intended that the scope of the invention be limited not by this detailed description, but rather by the claims appended hereto. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer-implemented process, comprising:
   using a computer to perform process actions for:
      receiving a set of one or more virtual objects;
      receiving a set of parameters for each virtual object;
      receiving characteristics of an arbitrary environment into which the virtual objects will be mapped;
      receiving a set of constraints that define relative relationships between any of the objects, any of the parameters of those objects, and any of the characteristics of the arbitrary environment;
      setting variables of an initial layout for each virtual object that maps each of the virtual objects into the environment;
      performing an iterative update of the layout of each object such that the layout of each object in each iterative update is consistent with the characteristics of the environment and is also consistent with the layout of each of the other objects until a global cost of the constraints is minimized; and
      wherein each iteration uses locally satisfiable proposals, which generate multiple different candidate layouts for each virtual object in each iteration, to select a single one of the multiple different candidate layouts for each virtual object by simultaneously updating and optimizing the variables of the layout of all of the virtual objects relative to one or more of the other virtual objects, the characteristics of the environment, and the constraints.

2. The computer-implemented process of claim 1 wherein each iteration further comprises process actions for using a fusion-move process that proposes multiple new labels for each variable of the layout.

3. The computer-implemented process of claim 2 wherein the multiple labels proposed for each variable during each iteration are automatically selected such that they satisfy any applicable constraints.

4. The computer-implemented process of claim 1 wherein a new iterative update of the layout of each object is performed whenever any constraint changes.

5. The computer-implemented process of claim 1 wherein a new iterative update of the layout of each object is performed whenever any of the characteristics of the arbitrary environment changes.

6. The computer-implemented process of claim 5 further comprising using the layout of each object existing prior to the changes to the environment as an additional set of constraints that forces the new iterative update of the layout of each object to be as close as possible to the layout of each object existing prior to the changes.

7. The computer-implemented process of claim 1 wherein a new iterative update of the layout of one or more of the other objects is performed whenever any of the parameters of any virtual object changes.

8. The computer-implemented process of claim 1 wherein:
the environment is an image;
wherein one or more of the virtual objects are text objects; and
wherein the iterative update of the layout of the text objects places those objects as overlays on the image in locations that avoid covering salient regions of the image.

9. The computer-implemented process of claim 1 wherein one or more of the virtual objects, the parameters, the environmental characteristics and the constraints are selected via a user interface from one or more libraries of predefined and user-configurable virtual objects, parameters, environmental characteristics and constraints.

10. The computer-implemented process of claim 1 wherein the environment is a real-world 3D environment and wherein the characteristics of the arbitrary dynamic environment include parameters of one or more physical objects in the environment.

11. The computer-implemented process of claim 10 wherein one or more of the virtual objects are components of an interactive 3D game that are mapped to the real-world 3D environment by the iterative update of the layout of each object.

12. A system, comprising:
a general purpose computing device; and
a computer program comprising program modules executable by the computing device, wherein the computing device is directed by the program modules of the computer program to:
receive a set of one or more virtual objects and a set of parameters for each virtual object;
receive a set of constraints that define relative relationships between any of the objects and any of the parameters of those objects;
performing an iterative update of a layout of each virtual object using the parameters of the other virtual objects and the set of constraints until a global cost of the constraints is minimized; and
wherein each iteration uses locally satisfiable proposals, which generate multiple different candidate layouts for each virtual object in each iteration, to select a single one of the multiple different candidate layouts for each virtual object by simultaneously updating and optimizing the layout of all of the virtual objects relative to one or more of the other virtual objects and the constraints.

13. The system of claim 12 further comprising:
receiving characteristics of an arbitrary environment into which the virtual objects will be mapped;
wherein the constraints further define relative relationships between any of the objects, any of the parameters of those objects, and any of the characteristics of the arbitrary environment; and
wherein each iteration of the iterative update uses locally satisfiable proposals to simultaneously update and optimize the layout of all of the virtual objects relative to one or more of the other virtual objects, the characteristics of the environment, and the constraints.

14. The system of claim 12 wherein each iteration further comprises:
using a fusion-move process that proposes multiple new labels for one or more variables of the layout; and
wherein the multiple labels proposed for any variable during each iteration are automatically selected such that they satisfy any applicable constraints.

15. The system of claim 12 further comprising:
automatically performing a new iterative update of the layout of the objects whenever any of the virtual objects, the parameters, or the constraints change; and
wherein the layout of each object existing prior to any changes to any of the virtual objects, the parameters, or the constraints is used to construct an additional set of constraints that forces the new iterative update of the layout of each object to be as close as possible to the layout of each object existing prior to the changes.

16. A computer-readable storage device having computer executable instructions stored therein, said instructions causing a computing device to execute a method comprising:
receiving a set of one or more virtual objects;
receiving a set of parameters for each virtual object;
receiving characteristics of an environment, including parameters of one or more physical objects present in the environment, into which the virtual objects will be mapped;
performing an iterative update of a configuration for each virtual object that maps each of the virtual objects into the environment based on the parameters of the other virtual objects and with the characteristics of the environment until a global configuration cost of the parameters associated with each virtual object is minimized; and
wherein each iteration uses locally satisfiable proposals, which generate multiple different candidate layouts for each virtual object in each iteration, to select a single one of the multiple different candidate layouts for each virtual object by simultaneously updating and optimizing the configuration of all of the virtual objects relative to one or more of the other virtual objects and the characteristics of the environment.

17. The computer-readable storage device of claim 16 wherein the iterative update is performed based on a set of constraints that define relative relationships between any of the virtual objects, any of the parameters of those virtual objects, and any of the characteristics of the environment.

18. The computer-readable storage device of claim 16 further comprising automatically performing a new iterative update of the configuration of the virtual objects whenever any of the virtual objects, the parameters, or the characteristics of the environment have changed.

19. The computer-readable storage device of claim 18 wherein the configuration of each virtual object existing prior to any changes to any virtual objects, the parameters, or the characteristics of the environment is used to construct a set of constraints that forces the new iterative update of the configuration of each virtual object to be as close as possible to the configuration of each object existing prior to the changes.

20. The computer-readable storage device of claim 16 wherein each iteration further comprises:
  using a fusion-move process that proposes multiple new labels for one or more variables of the configuration; and
  wherein the multiple labels proposed for any variable during each iteration are automatically selected such that they satisfy a set of constraints that define relative relationships between any of the virtual objects, any of the parameters of those virtual objects, and any of the characteristics of the environment.

* * * * *